(12) United States Patent
Kawamura et al.

(10) Patent No.: US 9,754,963 B1
(45) Date of Patent: Sep. 5, 2017

(54) MULTI-TIER MEMORY STACK STRUCTURE CONTAINING TWO TYPES OF SUPPORT PILLAR STRUCTURES

(71) Applicant: SANDISK TECHNOLOGIES LLC, Plano, TX (US)

(72) Inventors: Takeshi Kawamura, Yokkaichi (JP); Kota Funayama, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/243,260

(22) Filed: Aug. 22, 2016

(51) Int. Cl.
| | |
|---|---|
| H01L 29/76 | (2006.01) |
| H01L 27/11582 | (2017.01) |
| H01L 27/11519 | (2017.01) |
| H01L 27/11524 | (2017.01) |
| H01L 27/11556 | (2017.01) |
| H01L 27/11565 | (2017.01) |
| H01L 27/1157 | (2017.01) |
| H01L 27/105 | (2006.01) |

(52) U.S. Cl.
CPC .... *H01L 27/11582* (2013.01); *H01L 27/1052* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
CPC ......... H01L 27/11521; H01L 27/11582; H01L 27/1052
USPC ........................................ 257/314, 315, 316
See application file for complete search history.

(56) References Cited

U.S. PATENT DOCUMENTS

| | | | |
|---|---|---|---|
| 5,915,167 A | 6/1999 | Leedy | |
| 8,541,831 B2 * | 9/2013 | Chae ................. | H01L 27/11578 257/315 |
| 8,884,357 B2 | 11/2014 | Wang et al. | |
| 8,946,023 B2 | 2/2015 | Makala et al. | |
| 9,230,987 B2 | 1/2016 | Pachamuthu et al. | |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Tan N Tran
(74) *Attorney, Agent, or Firm* — The Marbury Law Group PLLC

(57) ABSTRACT

A first tier structure including a first alternating stack of first insulating layers and first sacrificial material layers is formed over a substrate. First support pillar structures are formed through the first tier structure. A second tier structure including a second alternating stack of second insulating layers and second sacrificial material layers is formed over the first tier structure. Memory stack structures and second support pillar structures are formed through the second tier structure. The first and second sacrificial material layers are replaced with first and second electrically conductive layers while the first support pillar structures, the second support pillar structures, and the memory stack structures provide structural support to the first and second insulating layers. By limiting the spatial extent of the first support pillar structures within the first tier structure, electrical short to backside contact via structures can be reduced.

24 Claims, 16 Drawing Sheets

(56) References Cited

U.S. PATENT DOCUMENTS

2016/0049423 A1  2/2016  Yoo et al.
2016/0204117 A1  7/2016  Liu et al.

OTHER PUBLICATIONS

U.S. Appl. No. 14/834,830, filed Aug. 25, 2015, SanDisk Technologies LLC.
U.S. Appl. No. 14/834,943, filed Aug. 25, 2015, SanDisk Technologies LLC.
U.S. Appl. No. 14/862,916, filed Sep. 23, 2015, SanDisk Technologies LLC.
U.S. Appl. No. 14/883,966, filed Oct. 15, 2015, SanDisk Technologies LLC.
U.S. Appl. No. 15/015,190, filed Feb. 4, 2016, SanDisk Technologies LLC.
U.S. Appl. No. 15/186,768, filed Jun. 20, 2016, SanDisk Technologies LLC.

* cited by examiner

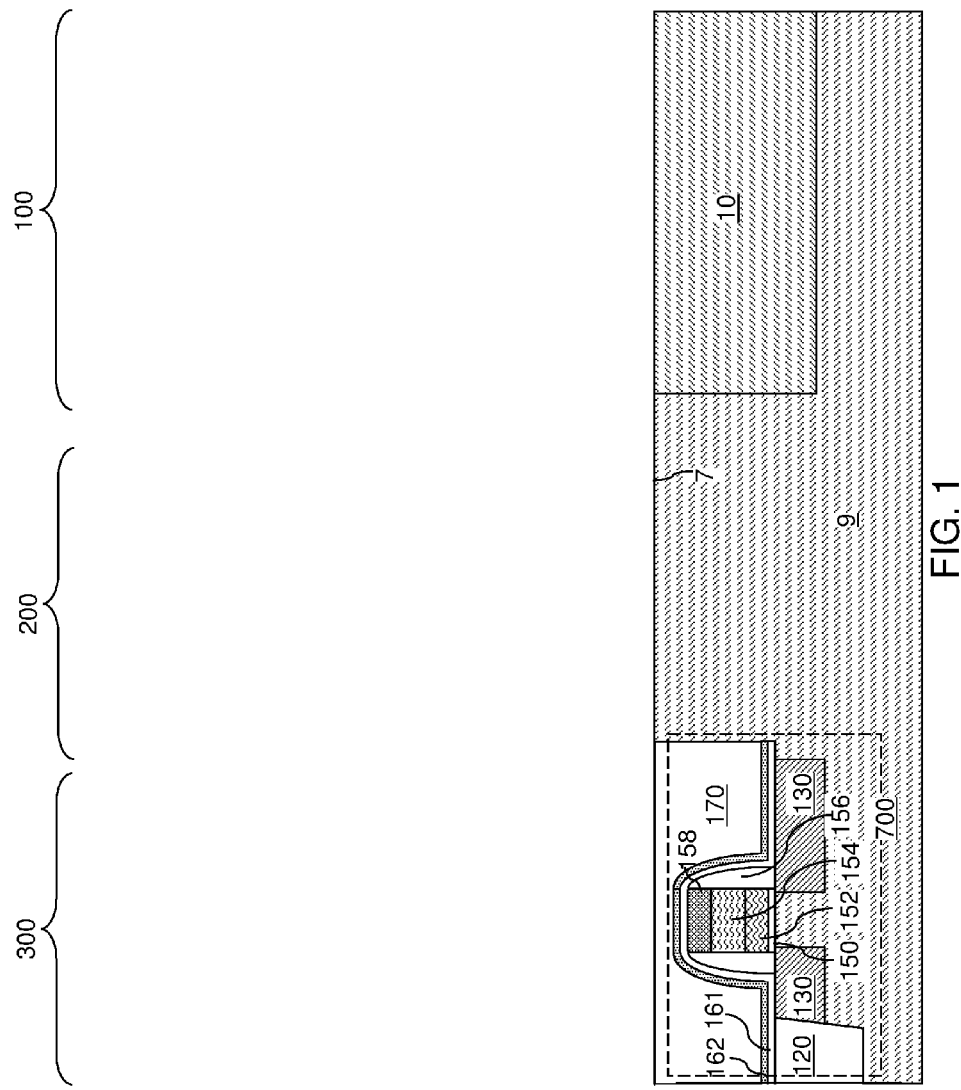

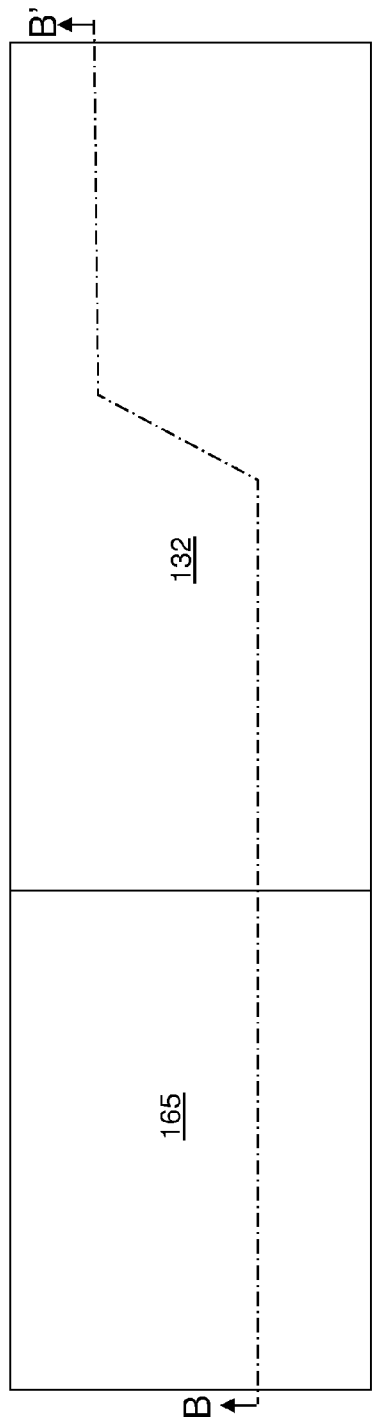
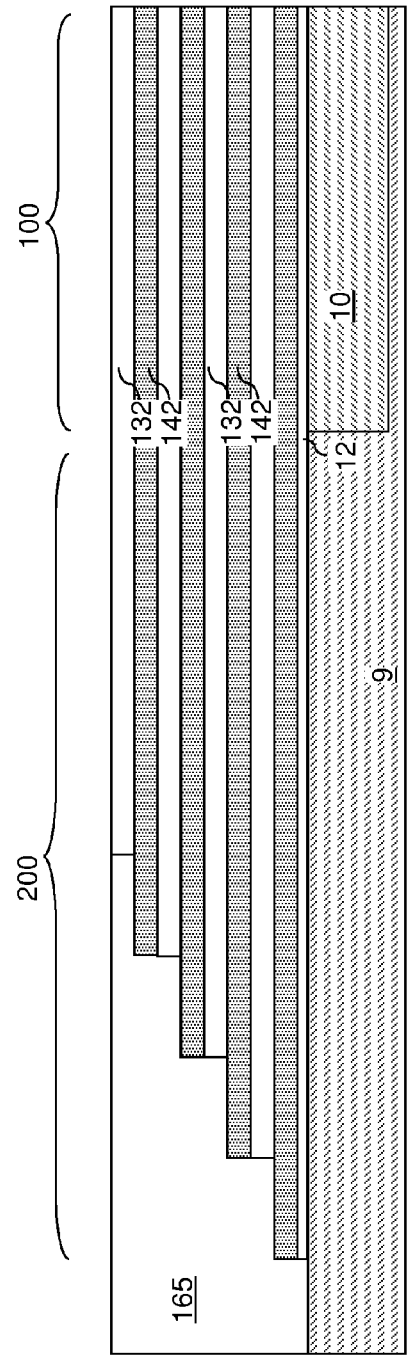
FIG. 2A
FIG. 2B

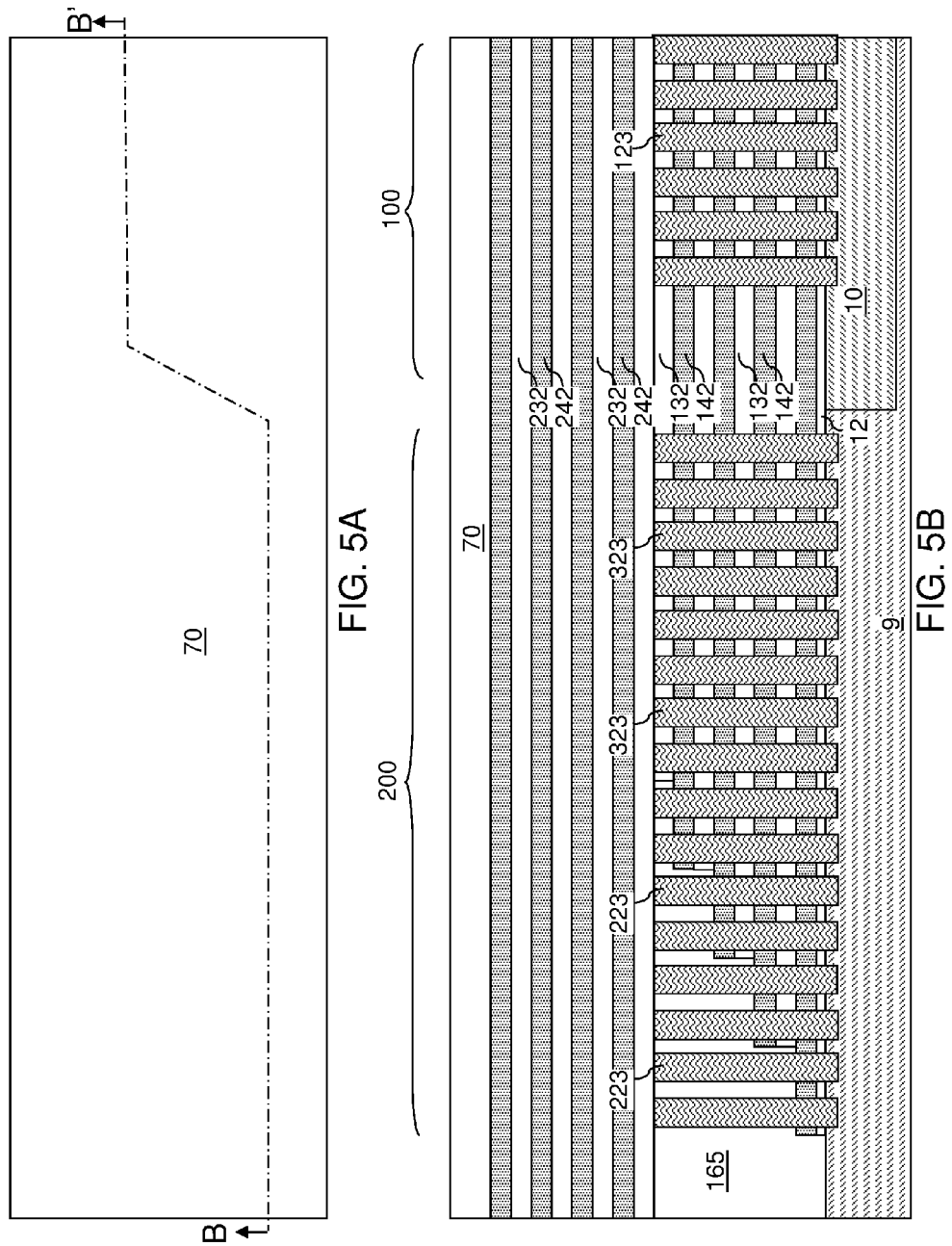

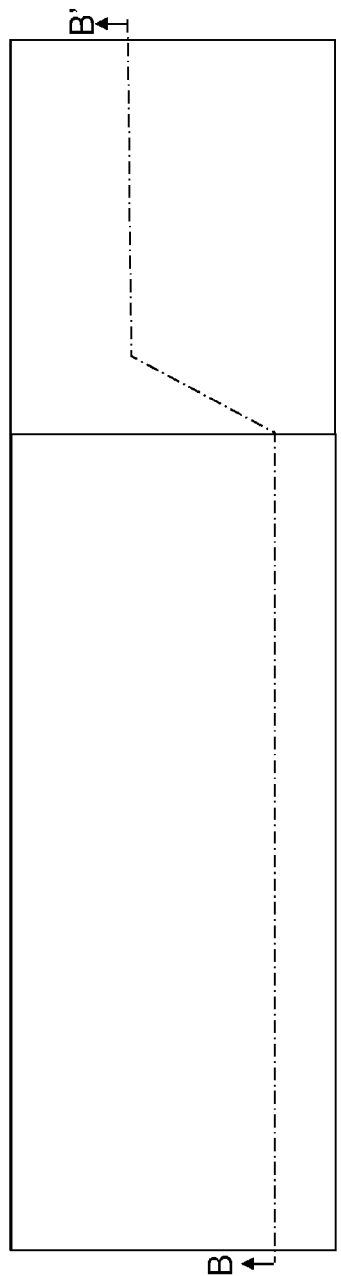
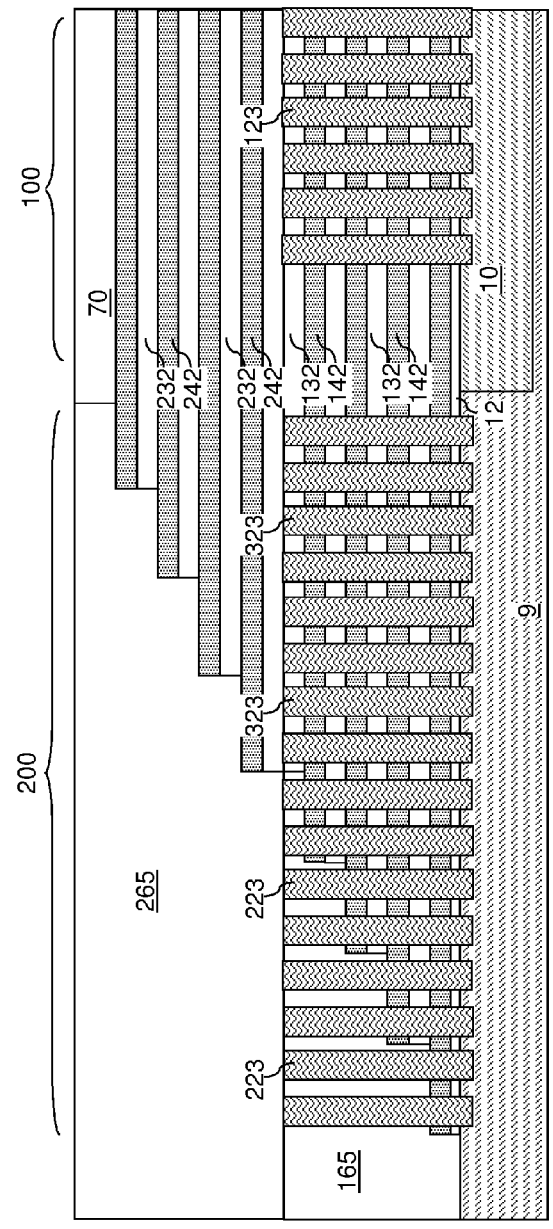
FIG. 6A
FIG. 6B

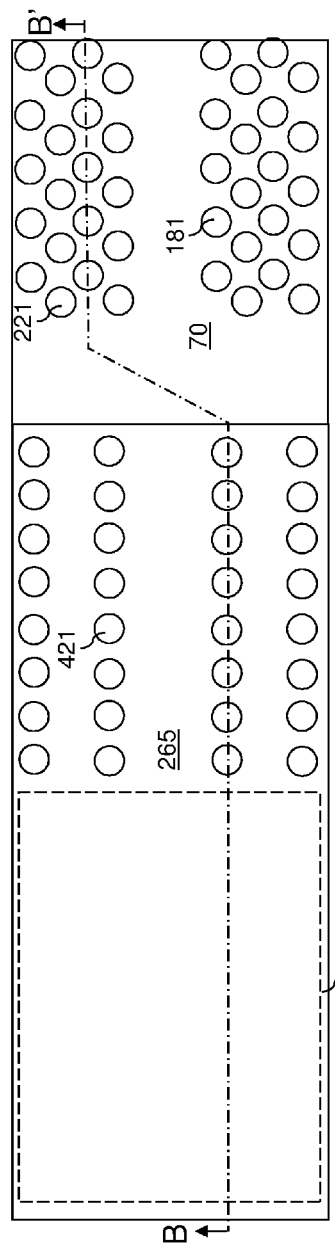
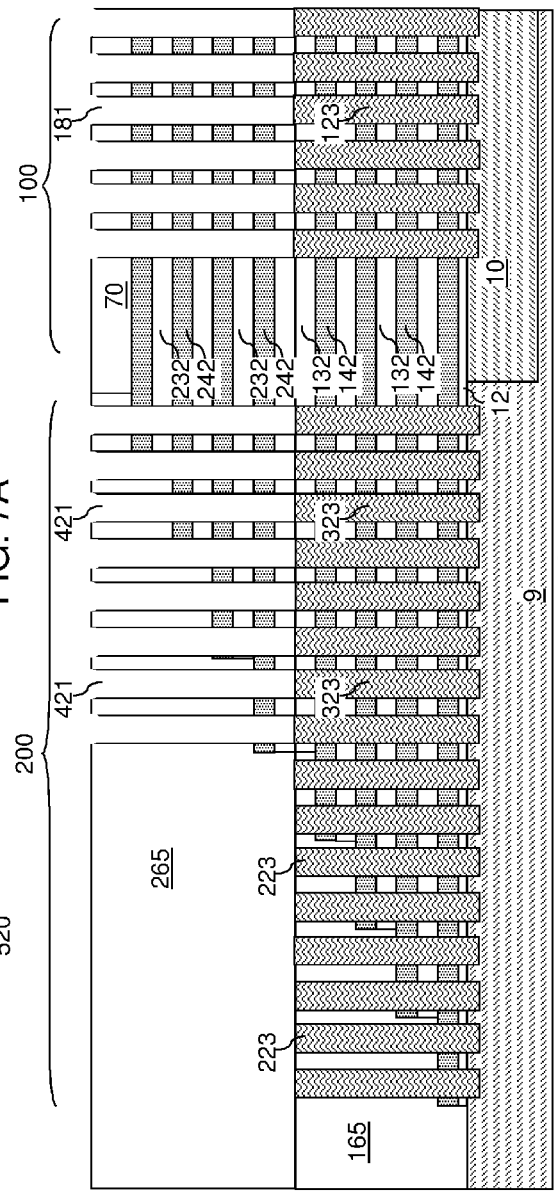
FIG. 7A
FIG. 7B

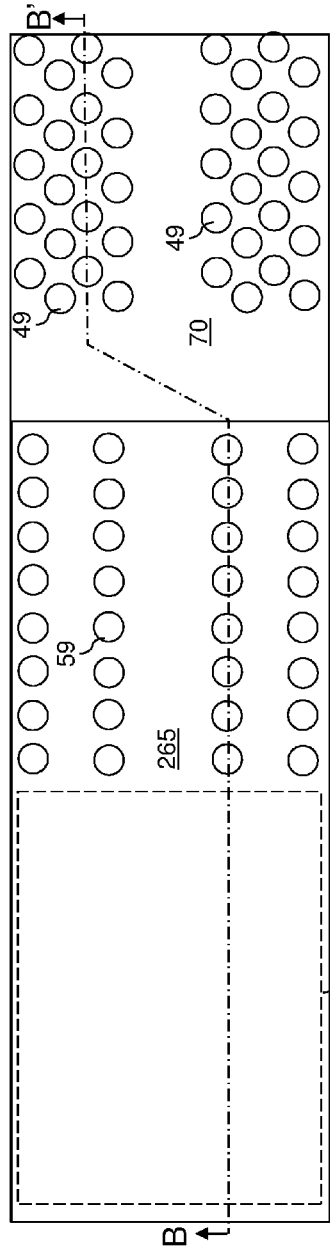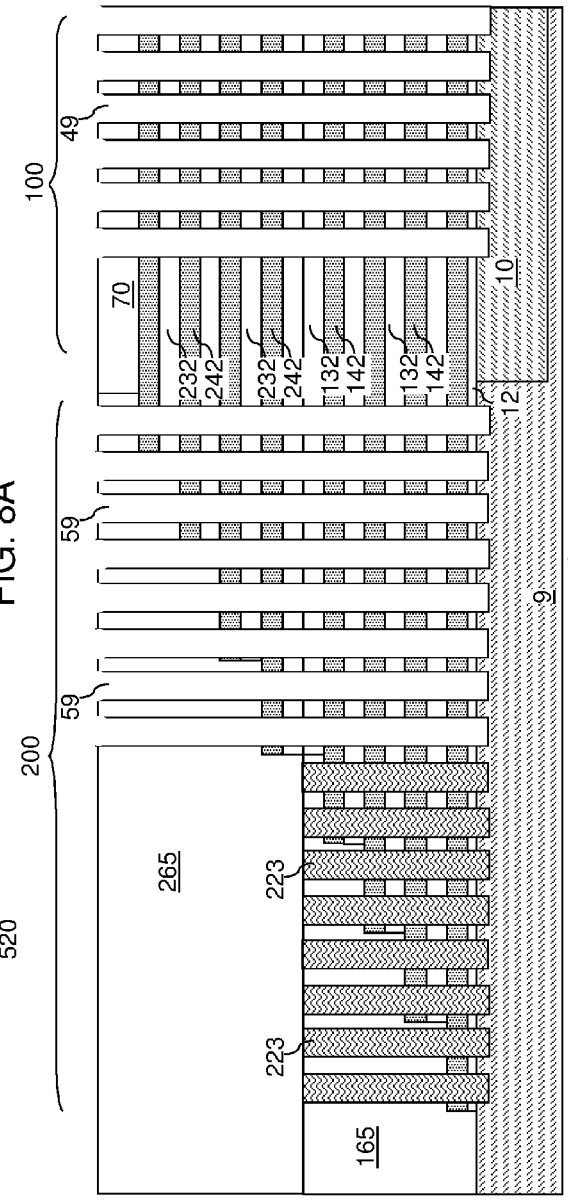

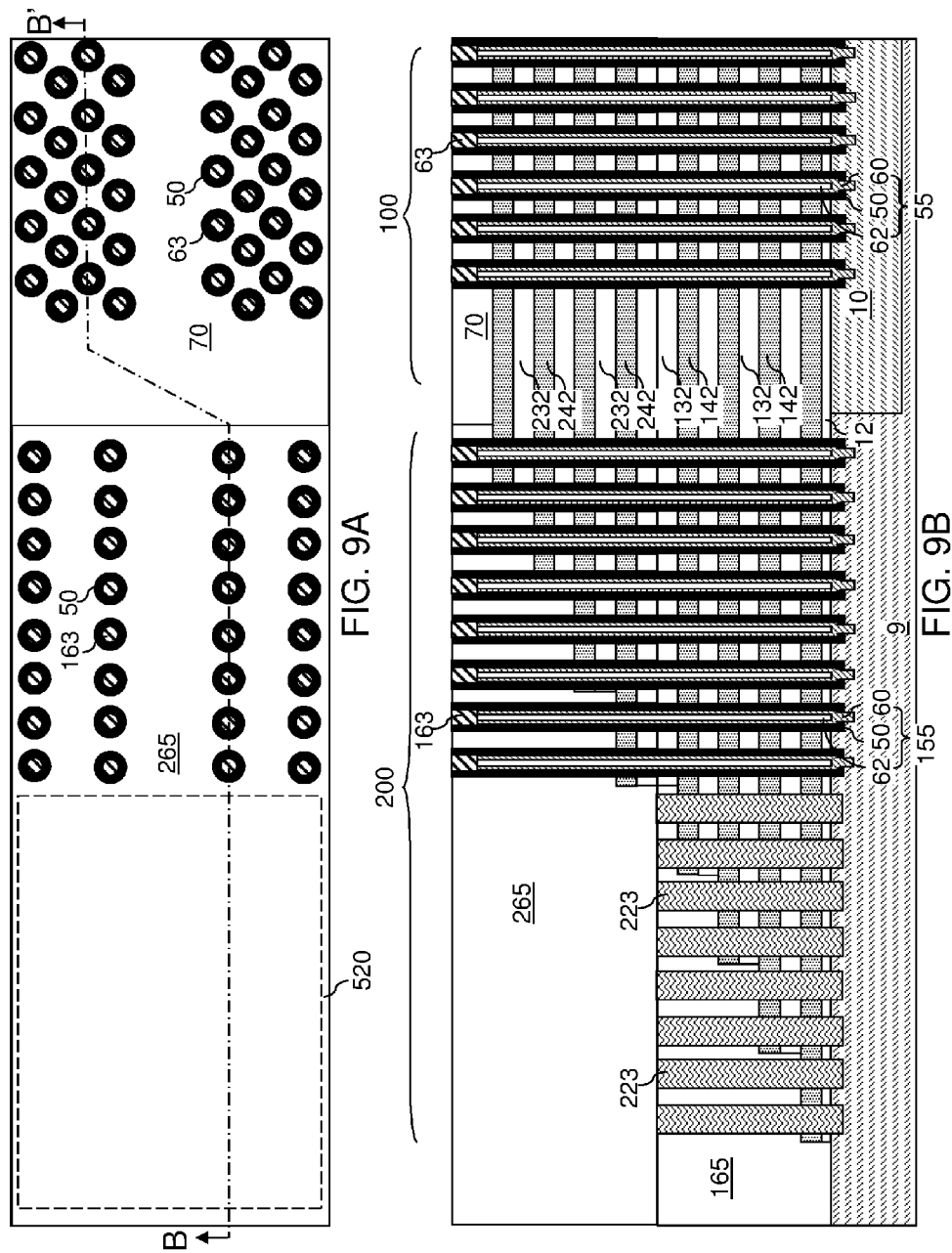

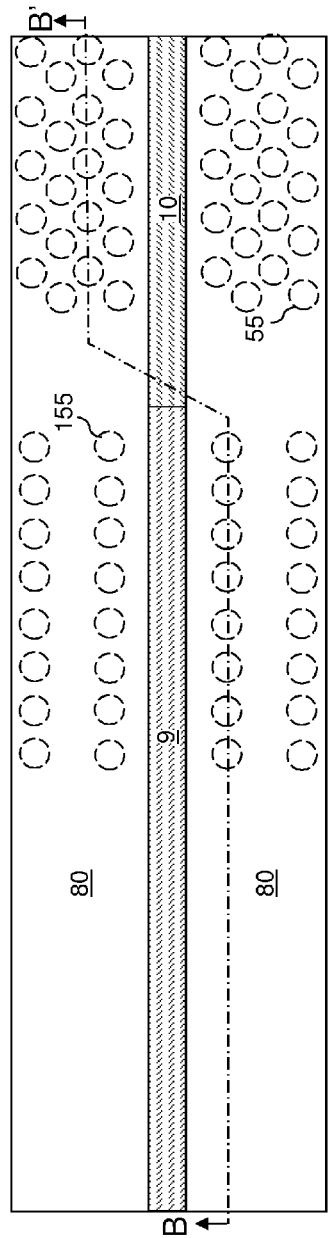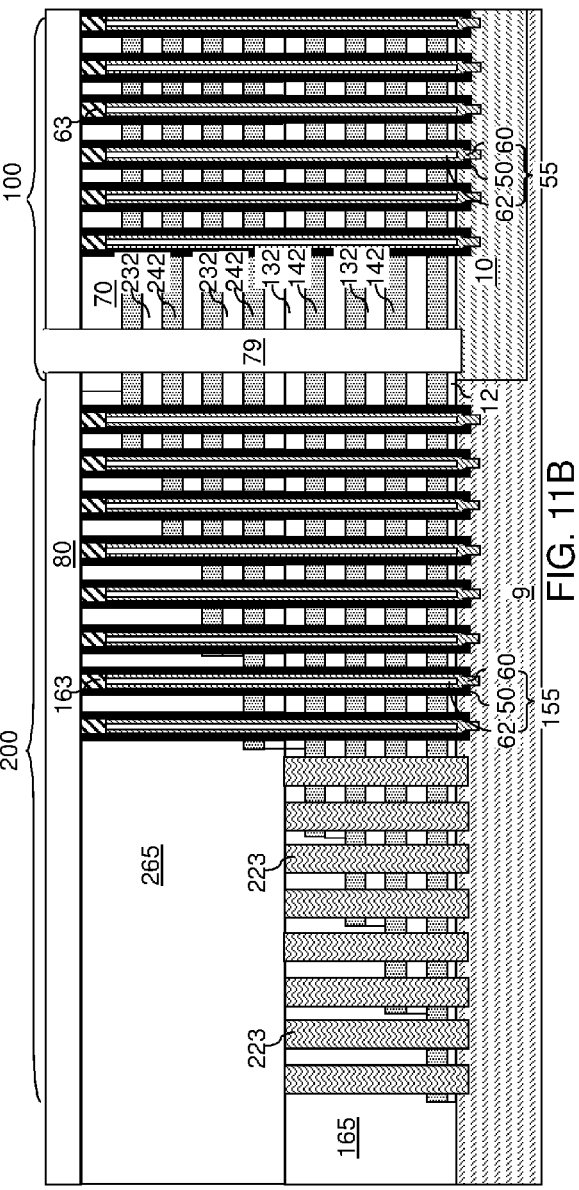
FIG. 11A
FIG. 11B

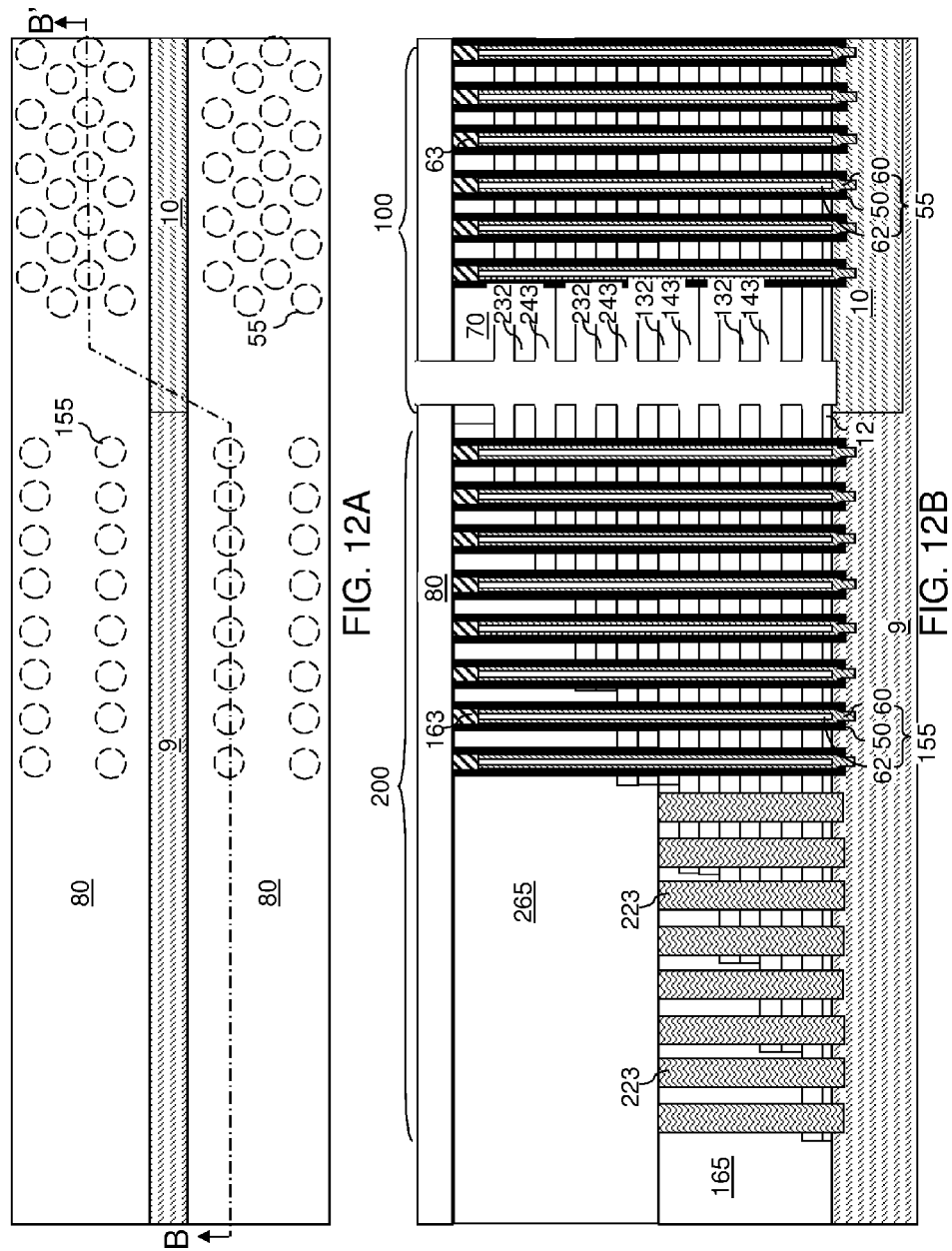

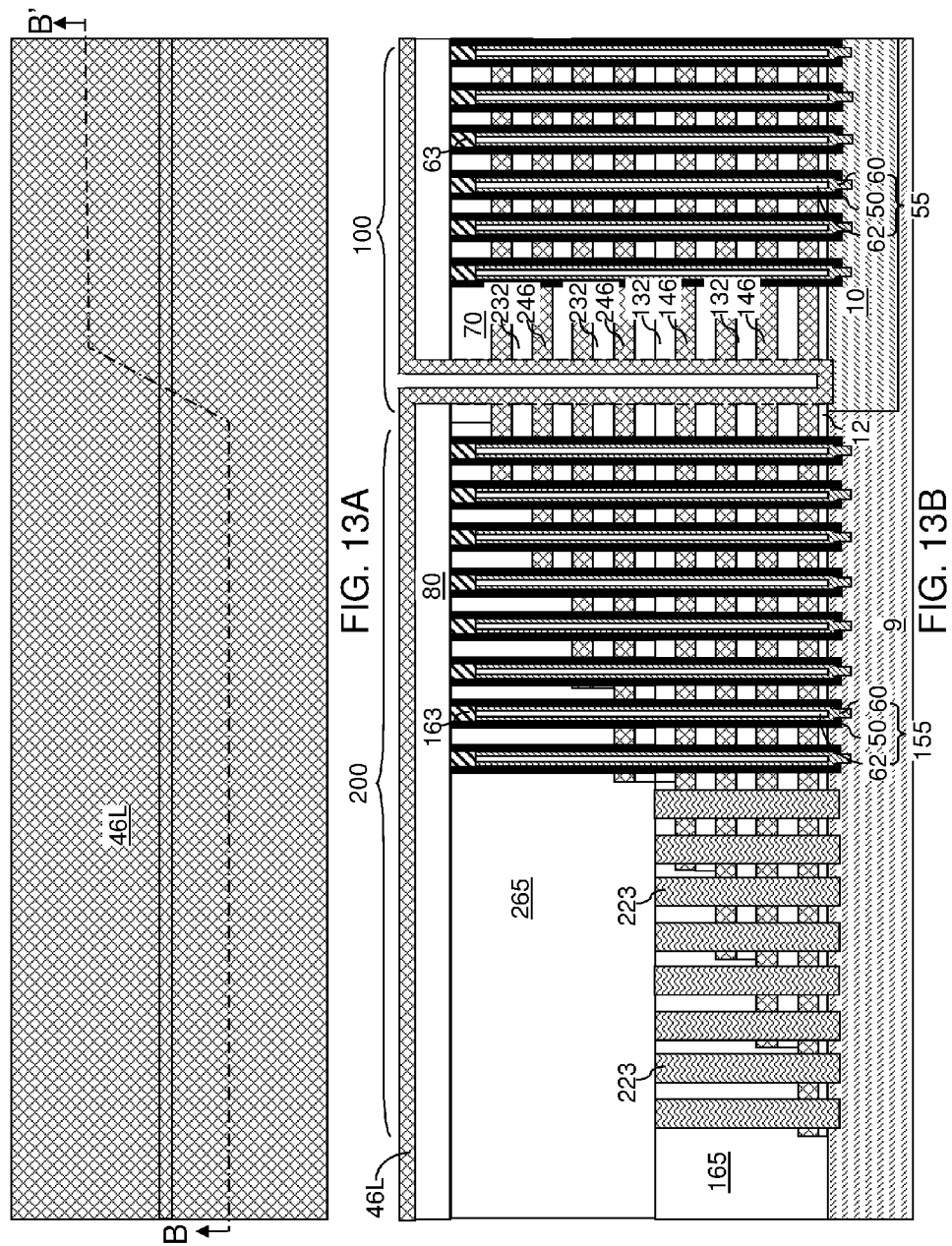

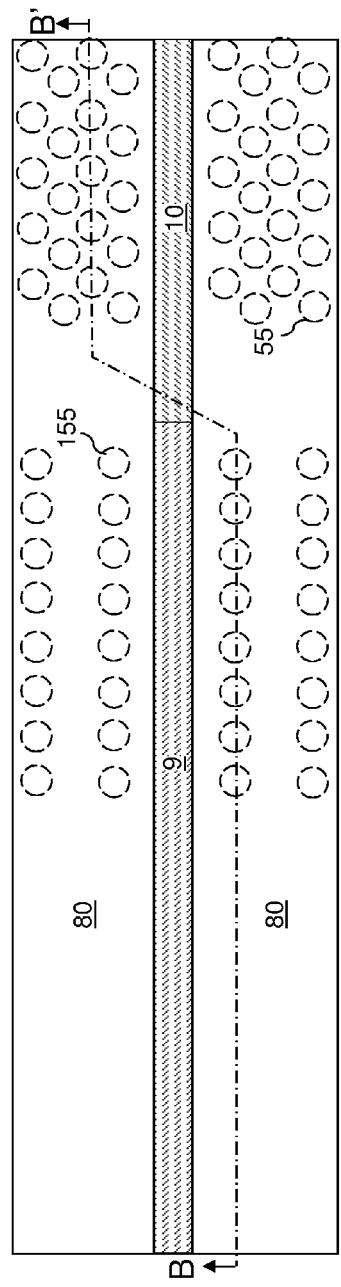
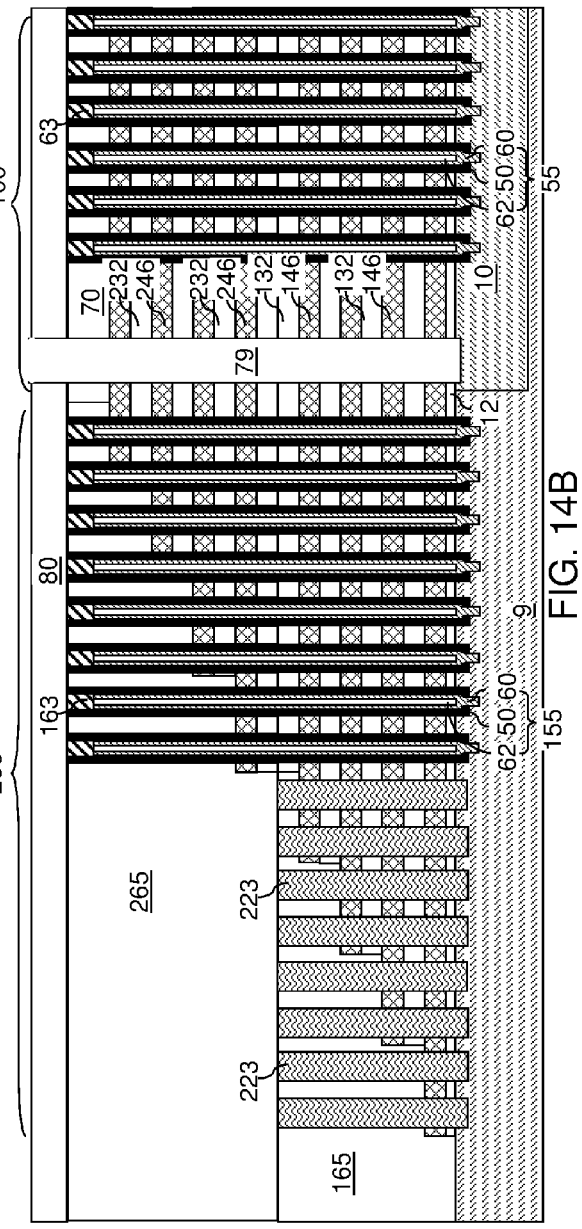
FIG. 14A
FIG. 14B

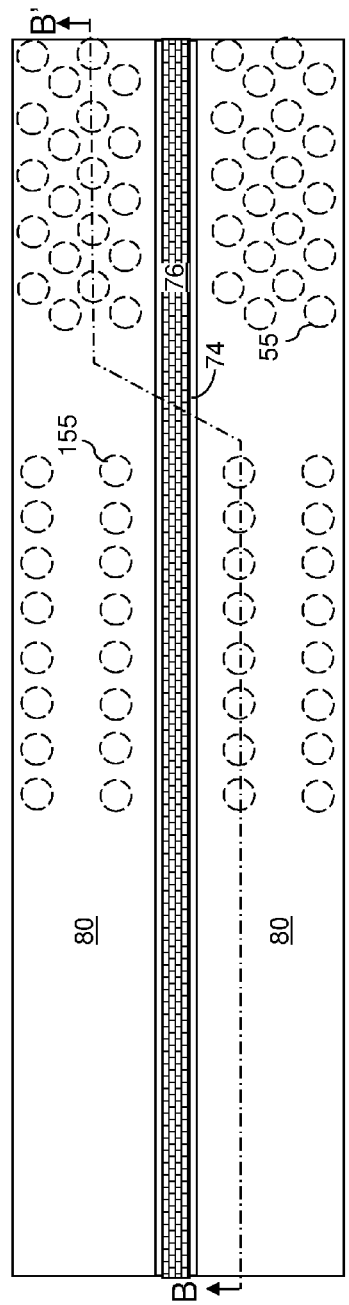
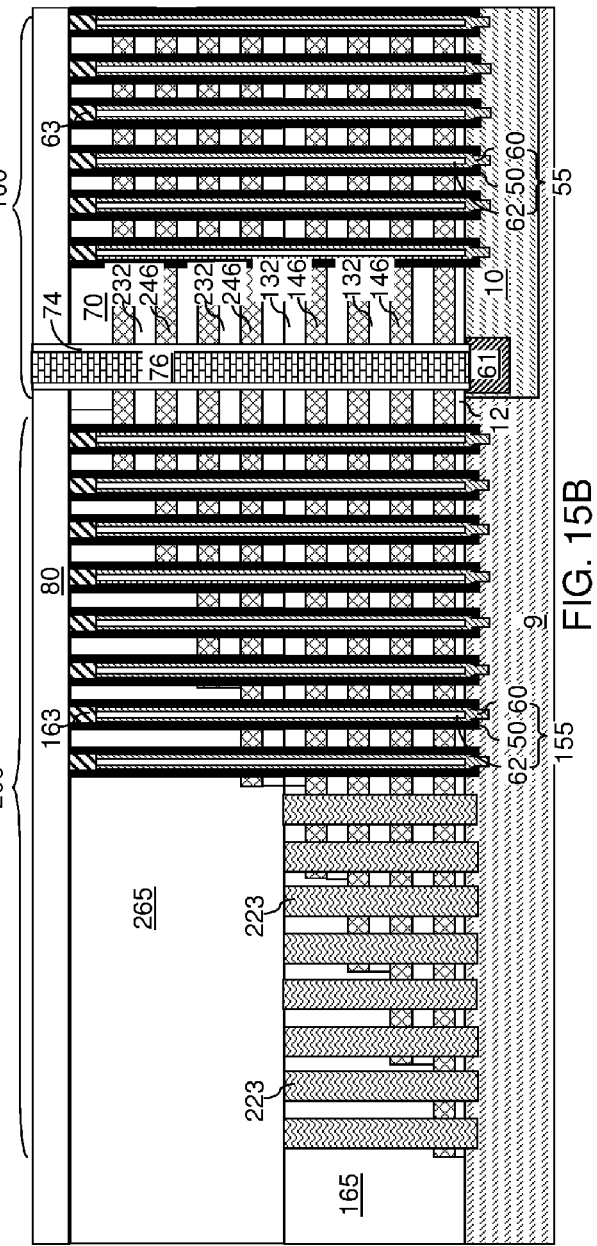
FIG. 15A
FIG. 15B

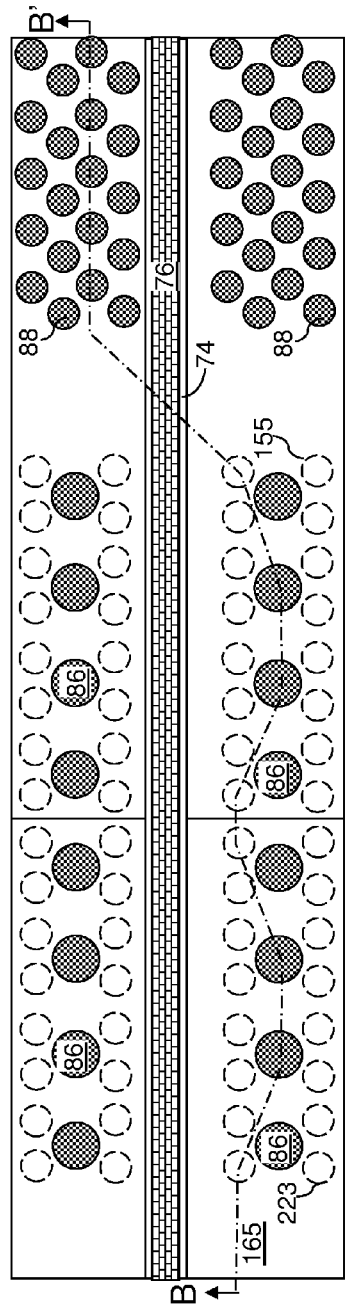
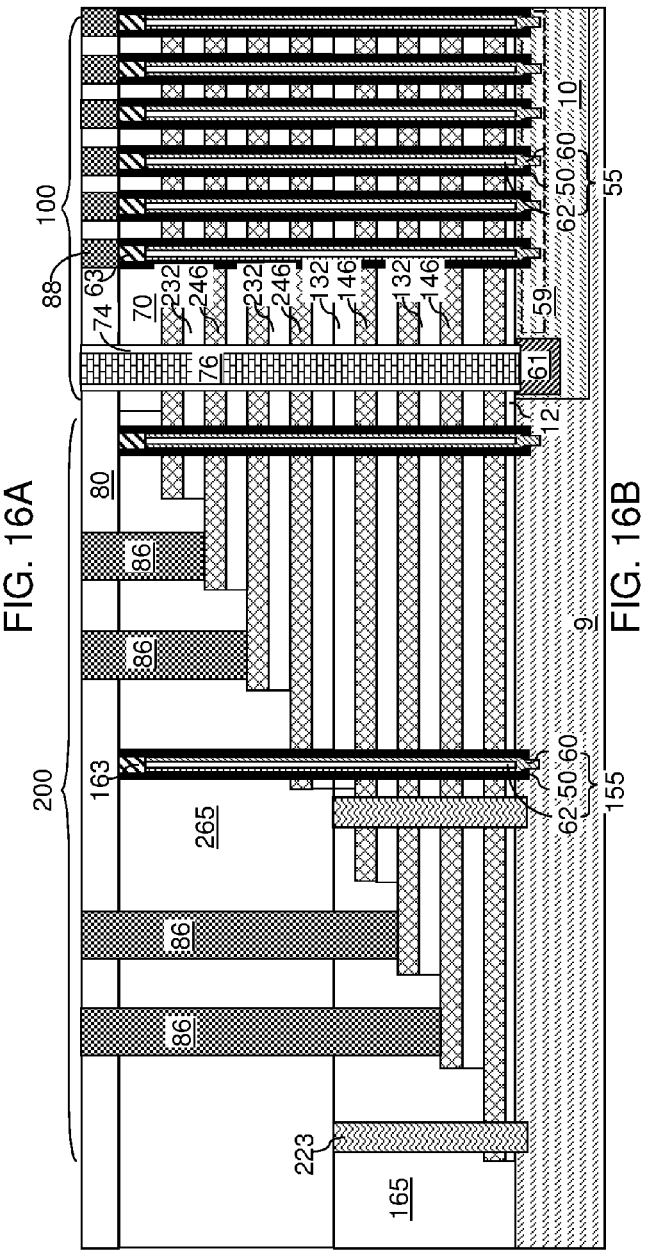
FIG. 16A
FIG. 16B

MULTI-TIER MEMORY STACK STRUCTURE CONTAINING TWO TYPES OF SUPPORT PILLAR STRUCTURES

FIELD

The present disclosure relates generally to the field of three-dimensional memory devices and specifically to multi-tier three-dimensional memory devices employing two types of support pillar structures and methods of making the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device is provided, which comprises: a first tier structure comprising a first alternating stack of first insulating layers and first electrically conductive layers and located over a substrate; a second tier structure comprising a second alternating stack of second insulating layers and second electrically conductive layers and located over the first tier structure; a plurality of memory stack structures extending through the first tier structure and the second tier structure; first support pillar structures extending through the first tier structure but not through the second tier structure; and second support pillar structures extending through the first tier structure and the second tier structure.

According to another aspect of the present disclosure, a method of forming a three-dimensional memory comprises forming a first tier structure over a substrate, wherein the first tier structure comprises a first alternating stack of first insulating layers and first sacrificial material layers, forming first support openings and first memory openings through the first tier structure, and depositing a fill material within the first support openings and the first memory openings, wherein first fill material portions formed in a first subset of the first support openings constitutes first support pillar structures. The method further comprises forming a second tier structure over the first tier structure after depositing the fill material, the second tier structure comprises a second alternating stack of second insulating layers and second sacrificial material layers, forming second support openings through the second tier structure, wherein the second support openings are formed on second fill material portions formed in a second subset of the first support openings but not on the first support pillar structures formed in first subset of the first support openings, removing the second fill material portions to form inter-tier support openings extending through the first and second tier structures, forming second support pillar structures in the inter-tier support openings and forming memory stack structures through the first and second tier structures, and replacing the first and second sacrificial material layers with first and second electrically conductive layers while the first support pillar structures, the second support pillar structures, and the memory stack structures provide structural support to the first and second insulating layers.

BRIEF DESCRIPTION OF THE DRAWINGS

FIG. 1 is a vertical cross-sectional view of an exemplary structure after formation of a first alternating stack of first insulating layers and first sacrificial material layers according to an embodiment of the present disclosure.

FIG. 2A is a top-down view of the exemplary structure after formation of first stepped surfaces and a first retro-stepped dielectric material portion according to an embodiment of the present disclosure.

FIG. 2B is a vertical cross-sectional view of the exemplary structure of FIG. 2A along the vertical plane B-B'.

FIG. 5A is a top-down view of the exemplary structure after formation of a second alternating stack of second insulating layers and second sacrificial material layers according to an embodiment of the present disclosure.

FIG. 5B is a vertical cross-sectional view of the exemplary structure of FIG. 5A along the vertical plane B-B'.

FIG. 6A is a top-down view of the exemplary structure after formation of second stepped surfaces and a second retro-stepped dielectric material portion according to an embodiment of the present disclosure.

FIG. 6B is a vertical cross-sectional view of the exemplary structure of FIG. 6A along the vertical plane B-B'.

FIG. 7A is a top-down view of the exemplary structure after formation of second memory openings and second support openings according to an embodiment of the present disclosure.

FIG. 7B is a vertical cross-sectional view of the exemplary structure of FIG. 7A along the vertical plane B-B'.

FIG. 8A is a top-down view of the exemplary structure after formation of inter-tier memory openings and inter-tier support openings according to an embodiment of the present disclosure.

FIG. 8B is a vertical cross-sectional view of the exemplary structure of FIG. 8A along the vertical plane B-B'.

FIG. 9A is a top-down view of the exemplary structure after formation of memory stack structures, second support pillar structures, drain regions, and dummy drain regions according to an embodiment of the present disclosure.

FIG. 9B is a vertical cross-sectional view of the exemplary structure of FIG. 9A along the vertical plane B-B'.

FIG. 11A is a top-down view of the exemplary structure after formation of a contact level dielectric layer and a backside contact trench according to an embodiment of the present disclosure.

FIG. 11B is a vertical cross-sectional view of the exemplary structure of FIG. 11A along the vertical plane B-B'.

FIG. 12A is a top-down view of the exemplary structure after formation of backside recesses according to an embodiment of the present disclosure.

FIG. 12B is a vertical cross-sectional view of the exemplary structure of FIG. 12A along the vertical plane B-B'.

FIG. 13A is a top-down view of the exemplary structure after formation of first and second electrically conductive layers and a continuous conductive material layer according to an embodiment of the present disclosure.

FIG. 13B is a vertical cross-sectional view of the exemplary structure of FIG. 13A along the vertical plane B-B'.

FIG. 14A is a top-down view of the exemplary structure after removal of the continuous conductive material layer according to an embodiment of the present disclosure.

FIG. 14B is a vertical cross-sectional view of the exemplary structure of FIG. 14A along the vertical plane B-B'.

FIG. 15A is a top-down view of the exemplary structure after formation of an insulating spacer, a source region, and a backside contact via structure according to an embodiment of the present disclosure.

FIG. 15B is a vertical cross-sectional view of the exemplary structure of FIG. 15A along the vertical plane B-B'.

FIG. 16A is a top-down view of the exemplary structure after formation of additional contact via structures according to an embodiment of the present disclosure.

FIG. 16B is a vertical cross-sectional view of the exemplary structure of FIG. 16A along the vertical plane B-B'.

DETAILED DESCRIPTION

Figure 3A:
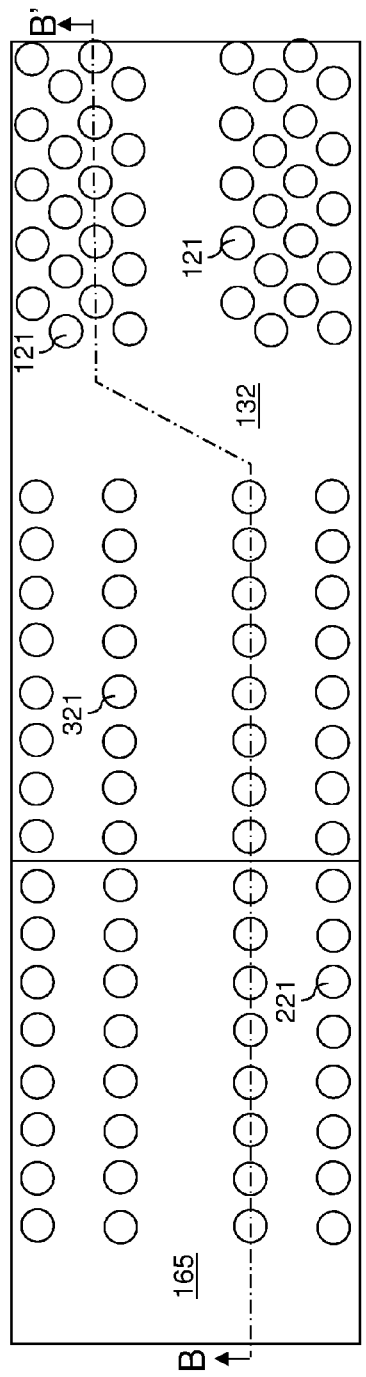
FIG. 3A is a top-down view of the exemplary structure after formation of first memory openings in a memory array region and first support openings in a contact region according to an embodiment of the present disclosure.

As discussed above, the present disclosure is directed to three-dimensional memory devices including a vertical stack of multilevel memory arrays and methods of making the same, the various aspects of which are described below. An embodiment of the disclosure can be employed to form semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. A layer may extend horizontally, vertically, and/or along a tapered surface. A substrate may be a layer, may include one or more layers therein, and/or may have one or more layer thereupon, thereabove, and/or therebelow.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. Optionally, a portion of the substrate semiconductor layer 9 can be vertically recessed to provide a recessed region, and the at least one semiconductor device 700 may be formed in the recessed region. Alternatively, an additional semiconductor material may be added to the substrate semiconductor layer 9 outside a region of the at least one semiconductor device 700, for example, by selective epitaxy after formation of the at least one semiconductor device.

The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed.

The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 may be formed within, or on top of, the substrate semiconductor layer 9 by ion implantation of electrical dopants (such as p-type dopants or n-type dopants) and/or by deposition of a single crystalline semiconductor material, for example, by selective epitaxy. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 300. The region in which a memory array is subsequently formed is herein referred to as a memory array region 100. A contact region 200 for subsequently forming stepped terraces of electrically conductive layers can be provided between the memory array region 100 and the peripheral device region 300.

Referring to FIGS. 2A and 2B, a gate dielectric layer 12 can be optionally formed above the semiconductor material layer 10 and the planarization dielectric layer 170. The gate dielectric layer 12 can include, for example, a silicon oxide layer and/or a dielectric metal oxide layer (such as an aluminum oxide layer and/or a hafnium oxide layer). The thickness of the gate dielectric layer 12 can be in a range from 3 nm to 30 nm, although lesser and greater thicknesses can also be employed.

An alternating stack of first material layers and second material layers is subsequently formed. Each first material layer can include a first material, and each second material layer can include a second material that is different from the first material. In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. The alternating stack formed by the first insulating layers 132 and the first sacrificial material layers 142 is herein referred to as a first alternating stack (132, 142), or a lower alternating stack (132, 142). In this case, the stack can include an alternating plurality of first insulating layers 132 and first sacrificial material layers 142. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the first sacrificial material layers 142 can be material layers that comprise silicon nitride or a semiconductor material including at least one of silicon and germanium.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first alternating stack (132, 142) can have a uniform thickness that is substantially invariant within each respective first sacrificial material layer 142.

The first tier structure (132, 142) can be patterned to form first stepped surfaces. The first stepped surfaces form a first terrace region, which is located within an area of the contact region 200. The contact region 200 includes a first stepped area in which the first stepped surfaces are formed, and a second stepped area in which additional stepped surfaces are to be subsequently formed in an second tier structure (to be subsequently formed over the first tier structure). The memory array region 100 is provided adjacent to the contact region 200. Memory devices including memory stack structures can be subsequently formed in the memory array region 100. The first stepped surfaces can be formed, for example, by forming a mask layer with an opening therein, etching a cavity within the levels of the topmost first sacrificial material layer 142 and the topmost first insulating layer 132, and iteratively expanding the etched area and vertically recessing the cavity by etching each pair of a first insulating layer 132 and a first sacrificial material layer 142 located directly underneath the bottom surface of the etched cavity within the etched area. The first alternating stack (132, 142) is patterned such that each underlying first sacrificial material layer 142 laterally protrudes farther than any overlying first sacrificial material layer 142 in the etched region, and each underlying first insulating layer 132 laterally protrudes farther than any overlying first insulating layer 132 in the etched region. The contact region can be a contact region of the first alternating stack (132, 142). The cavity is herein referred to as a first stepped cavity.

A dielectric material is deposited to fill the first stepped cavity. Excess portions of the dielectric material overlying the topmost surface of the first alternating stack (132, 142), are removed for example, by chemical mechanical planarization. The remaining portion of the deposited dielectric material forms a first dielectric material portion, which is herein referred to as a first retro-stepped dielectric material portion 165. The first retro-stepped dielectric material portion 165 is formed on the first stepped surfaces. The first dielectric material portion 165 is retro-stepped. As used herein, a "retro-stepped" element refers to an element that has stepped surfaces and a horizontal cross-sectional area that increases monotonically as a function of a vertical distance from a top surface of a substrate on which the element is present. The first tier structure, which is also referred to as a first stack structure, comprises the first alternating stack (132, 142) and the first retro-stepped dielectric material portion 165. The first retro-stepped dielectric material portion 165 is incorporated into the first tier structure (132, 142, 165).

Figure 3B:
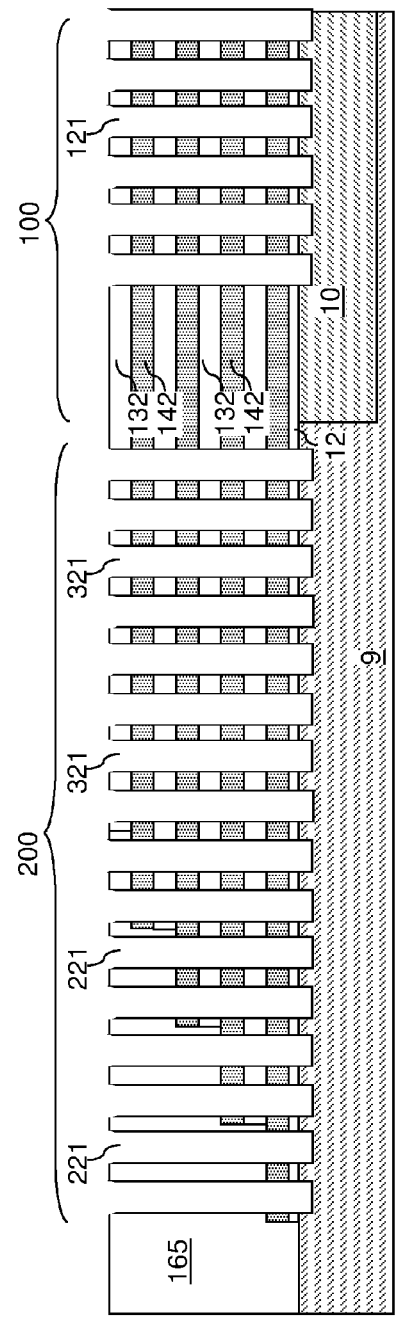
FIG. 3B is a vertical cross-sectional view of the exemplary structure of FIG. 3A along the vertical plane B-B'.

Referring to FIGS. 3A and 3B, first openings (121, 221, 321) extending to a top surface of the substrate (9, 10) are formed through the first tier structure (132, 142, 165). To form the first openings (121, 221, 321), a lithographic material stack (not shown) including at least a photoresist layer can be formed over the first tier structure (132, 142, 165), and can be lithographically patterned to form openings within the lithographic material stack. The pattern in the lithographic material stack can be transferred through the entirety of the first tier structure (132, 142, 165) by at least one anisotropic etch that employs the patterned lithographic material stack as an etch mask. Portions of the first tier structure (132, 142, 165) underlying the openings in the patterned lithographic material stack are etched to form the first openings (121, 221, 321). In other words, transfer of the pattern in the patterned lithographic material stack through the first tier structure (132, 142, 165) forms the first openings (121, 221, 321).

The first openings (121, 221, 321) include first memory openings 121 that are formed in the memory array region 100 and first support openings (221, 321) that are formed in the contact region 200. The first support openings (221, 321) include a first subset of distal first support openings 221 that are more distal from the memory device region 100 than a second subset of proximal first support openings 321. The distal first support openings 221 are formed through the first retro-stepped dielectric material portion 165 and the first stepped surfaces of the first alternating stack (132, 142). The second subset of the first support openings (221, 321) is a complementary subset of the first subset of the first support openings (221, 321). The proximal second support openings 321 are formed through each layer within the first alternating stack (132, 142). In one embodiment, the proximal second support openings 321 are not formed through the first retro-stepped dielectric material portion 165.

In one embodiment, the chemistry of the anisotropic etch process employed to etch through the materials of the first alternating stack (132, 142) can alternate to optimize etching of the first and second materials in the first alternating stack (132, 142) while providing a comparable average etch rate for the first dielectric material portion 165. The anisotropic etch can be, for example, a series of reactive ion etches. The sidewalls of the first openings (121, 221, 321) can be substantially vertical, or can be tapered. Subsequently, the patterned lithographic material stack can be subsequently removed, for example, by ashing. The first memory openings 121 and the first support openings (221, 321) can be formed concurrently employing the same set of anisotropic etch processes.

Optionally, a dielectric mask layer (not shown) may be provided on top of, or in lieu of, the topmost insulating layer 132 in the alternating stack (132, 142). The dielectric mask layer can have a different composition than the insulating layers 132, and may function as an etch stop dielectric layer during subsequent steps.

In one embodiment, the substrate (9, 10) can be employed as a stopping layer for the anisotropic etch process. In one embodiment, the first openings (121, 221, 321) may extend below the top surface of the substrate (9, 10) by an overetch. The lateral dimensions (e.g., a diameter) of the first openings (121, 221, 321) can be from about 20 nm to 200 nm at an upper portion of each first opening (121, 221, 321), and can be about 10 nm to 150 nm at a lower portion of each first opening (121, 221, 321). The sidewalls of the first openings (121, 221, 321) may have a bulging vertical cross-sectional profile such that a middle portion of each first opening (121, 221, 321) laterally protrudes more than the upper portion and the lower portion of the first opening (121, 221, 321). This tendency is greater for the distal first support openings 221 that are formed through the first retro-stepped dielectric material portion 165 than for the first memory openings 121 or for the proximal support openings 321 in case the dielectric material of the first retro-stepped dielectric material portion 165 is more prone to lateral etch than the first sacrificial material layers 142. For example, if the first sacrificial material layers 142 include silicon nitride and if the first retro-stepped dielectric material portion 165 includes silicon oxide, a continuous region of the silicon oxide around a sidewall of each distal first support opening 221 is conducive to formation of sidewalls having a laterally protruding convex profile.

In one embodiment, the first memory openings 121 can be formed as an array of openings, which can be a periodic two-dimensional array of openings. The first support openings (221, 321) can be formed as discrete openings that are mutually separated from one another, and may, or may not, form a periodic two-dimensional array pattern. In one embodiment, the first support openings (221, 321) may form a plurality of periodic one-dimensional array patterns.

Figure 4A:
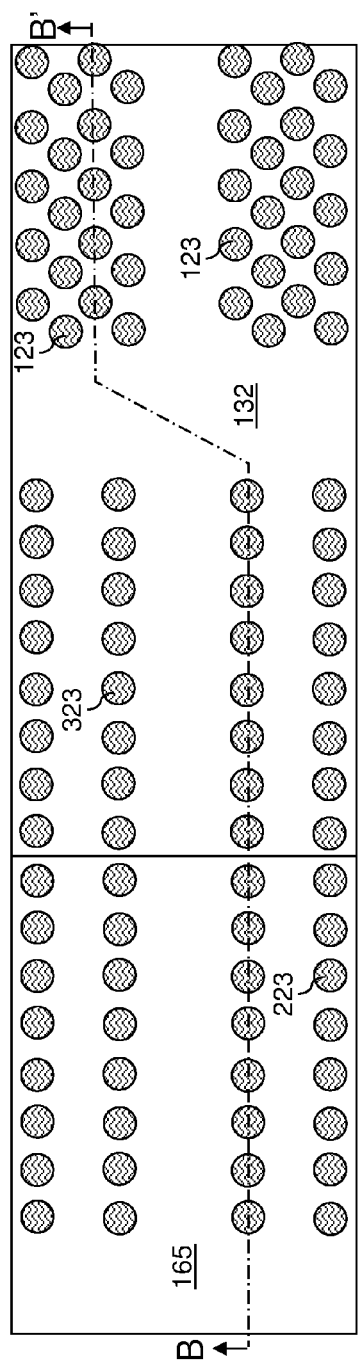
FIG. 4A is a top-down view of the exemplary structure after formation of fill material portions in the first support openings and in the first memory openings according to an embodiment of the present disclosure.
Figure 4B:
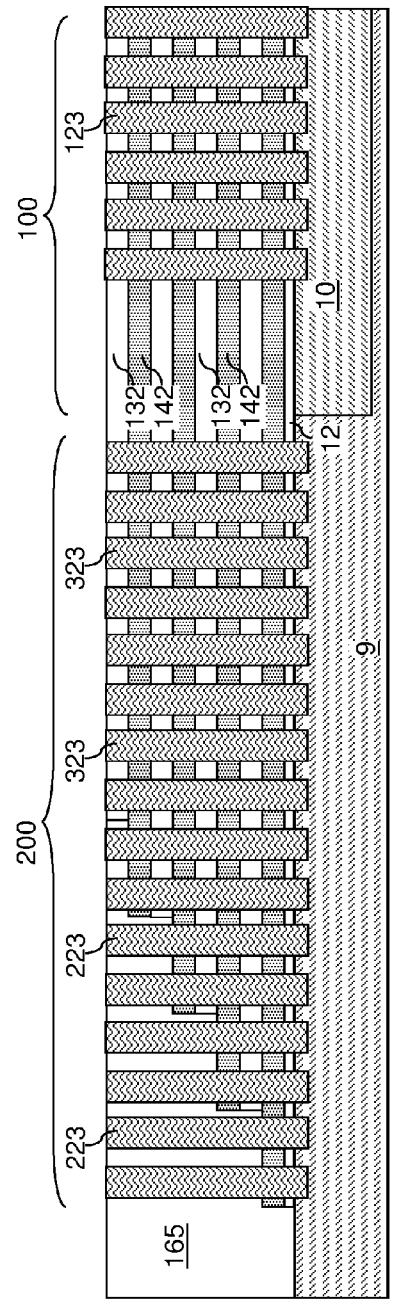
FIG. 4B is a vertical cross-sectional view of the exemplary structure of FIG. 4A along the vertical plane B-B'.

Referring to FIGS. 4A and 4B, a fill material can be deposited in the first support openings (221, 321) and in the first memory openings 121 simultaneously. The fill material can be an insulating material or a semiconducting material. The fill material has a composition different from the material of the insulating layers, and can have electrical resistivity greater than 10 Ω-cm. In one embodiment, the electrical resistivity of the fill material can be greater than 100 Ω-cm. In one embodiment, the electrical resistivity of the fill material can be greater than 1,000 Ω-cm, such as 10,000 to $10^{20}$ Ω-cm, including $10^5$ to $10^{17}$ Ω-cm. Non-limiting examples of the fill material includes amorphous silicon, polycrystalline silicon, an amorphous silicon-germanium alloy, and a polycrystalline silicon-germanium alloy. Preferably the semiconductor material, such as amorphous silicon, is undoped (i.e., intrinsic). Excess portions of the deposited fill material can be removed from above the horizontal plane including the topmost surface of the first alternating stack (132, 142). Remaining portions of the deposited fill material in the first openings (121, 221, 321) are herein referred to as fill material portions (123, 223, 323).

The fill material portions (123, 223, 323) include first fill material portions 223 that are formed in the distal first support openings 221 (which are a first subset of the first support openings (221, 321)), second fill material portions 323 that are formed in the proximal first support openings 321 (which are a second subset of the first support openings (221, 321)), and third fill material portions 123 that are formed in the first memory openings 121. The first fill material portions 223 formed in the first subset 221 of the first support openings constitutes first support pillar structures 223 that extend through the first retro-stepped dielectric material portion 165 and the first stepped surfaces on the first alternating stack (132, 142). Each instance of the first support pillar structures 223 comprises a material having electrical resistivity greater than 10 Ω-cm and having a composition different from the material of the first insulating layers 132.

Referring to FIGS. 5A and 5B, a second alternating stack (232, 242) of material layers is subsequently formed on the top surface of the first tier structure (132, 142, 165). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers and the fourth material layers can be second insulating layers 232 and second sacrificial material layers 242, respectively. The third material of the second insulating layers 232 can be at least one insulating material. The fourth material of the second sacrificial material layers 242 is a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material. For example, the first and second sacrificial material layers (142, 242) can include silicon nitride, and the first and second insulating layers (132, 232) can include silicon oxide.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

A dielectric cap layer 70 can be subsequently formed over the second stack (232, 242). The dielectric cap layer 70 includes a dielectric material that is different from the material of the second sacrificial material layers 242. The dielectric cap layer 70 includes a dielectric material that may be the same as, or different from, the material of the second insulating layers 232. In one embodiment, the dielectric cap layer 70 can include silicon oxide.

The second alternating stack (232, 242) and the dielectric cap layer 70 constitute a second tier structure (232, 242, 70). The first support pillar structures 223 extend through the first tier structure (132, 142, 165), and have respective topmost surfaces at an interface between the first tier structure (132, 142, 165) and the second tier structure (232, 242, 70).

Referring to FIGS. 6A and 6B, additional stepped surfaces are formed in the second stack (232, 242) in the contact region 200. The additional stepped surfaces are herein referred to as second stepped surfaces. The second stepped surfaces are formed in a second stepped area, which is adjacent to, and does not overlie, the first stepped area of the first stepped surfaces within the first tier structure (132, 142, 165). The second stepped surfaces can be adjacent to, and do not overlie, the stepped interface between the first alternating stack (132, 146) and the first retro-stepped dielectric material portion 165. The second stepped surfaces overlie the second fill material portions 323 (which are formed in the proximal first support openings 321, i.e., the second subset of the first support openings (221, 321)), and are laterally offset from the area of the first support pillar structures 223 (which are formed in the distal first support openings 221, i.e., the first subset of the first support openings (221, 321)).

The second stepped surfaces can be formed, for example, by forming a mask layer with an opening therein, etching a cavity within the levels of the topmost second sacrificial material layer 242 and the topmost second insulating layer 232, and iteratively expanding the etched area and vertically recessing the cavity by etching a pair of a second insulating layer 232 and a second sacrificial material layer 242 located directly underneath the bottom surface of the etched cavity within the etched area. The second stack (232, 242) is patterned such that each underlying second sacrificial material layer 242 laterally protrudes farther than any overlying second sacrificial material layer 242 in the etched region, and each underlying second insulating layer 232 laterally protrudes farther than any overlying second insulating layer 232 in the etched region. The etched area includes the area of the contact region 200, which includes the contact area for the second stack (232, 242) and a contact area for the first alternating stack (132, 142).

Thus, the second stack (232, 242) is patterned to form the second stepped surfaces thereupon. The cavity formed by removal of portions of the second stack (232, 242) is herein referred to as a second stepped cavity. The area of the second stepped cavity includes the area of the first retro-stepped first dielectric material portion 165, from which all layers of the second stack (232, 242) are removed. The area of the second stepped cavity further includes the area of the second stepped surfaces of the second stack (232, 242).

Dielectric material is deposited to fill the second stepped cavity. Excess portions of the dielectric material overlying the topmost surface of the second stack (232, 242) are removed, for example, by chemical mechanical planarization. The remaining portion of the deposited dielectric material is retro-stepped, and thus, forms a second dielectric material portion, which is herein referred to as a second retro-stepped dielectric material portion 265. The second retro-stepped dielectric material portion 265 is located on, and over, the second stepped surfaces of the second stack (232, 242). The second retro-stepped dielectric material portion 265 is formed on the second stepped surfaces. The contact region 200 comprises a region of the first stepped surfaces and a region of the second stepped surfaces. Upon formation of the second retro-stepped dielectric material portion 265, the second retro-stepped dielectric material portion 265 is incorporated into the second tier structure (232, 242, 70, 265), i.e., becomes an element of the second tier structure (232, 242, 70, 265).

The first stepped surfaces and the second stepped surfaces are collectively referred to as "stepped surfaces." A first portion of the stepped surfaces is the first stepped surfaces located in the first tier structure (132, 142, 165). As second portion of the stepped surfaces is the second stepped surfaces located in the second tier structure (232, 242, 70, 265). The first stepped surfaces and the second stepped surfaces are located within the contact region 200.

The region of the stepped surfaces is herein referred to as a terrace region. Each sacrificial material layer (142, 242) among the first and second sacrificial material layers (142, 242) that is not a bottommost first sacrificial material layer 142 laterally extends less than any underlying layer among the first and second sacrificial material layers (142, 242). The terrace region includes stepped surfaces of the first and second alternating stacks (132, 142, 232, 242) that continuously extend from a bottommost layer within the first alternating stack (132, 142) to a topmost layer within the second alternating stack (232, 242).

Referring to FIGS. 7A and 7B, second openings (181, 421) are formed through the second tier structure (232, 242, 265, 70) to the top surface of the first tier structure (132, 142, 165). The second openings (181, 421) include second memory openings 181 that are formed in the memory array region 100 and second support openings 421 that are formed in the contact region 200. Each second memory opening 181 can be formed on top of a respective third fill material portion 123 (which are present in the first memory opening 121). Each second support opening 421 can be formed on top of a respective the second fill material portions 323 (which are present within the proximal first support opening 321). However, no second support openings are formed on top of the respective first fill material portions 223.

For example, a lithographic material stack (not shown) including at least a photoresist layer can be formed over the second tier structure (232, 242, 265, 70), and can be lithographically patterned to form openings within the lithographic material stack. The pattern in the lithographic material stack can be transferred through the entirety of the second tier structure (232, 242, 265, 70) by at least one anisotropic etch that employs the patterned lithographic material stack as an etch mask. Portions of the second tier structure (232, 242, 265, 70) underlying the openings in the patterned lithographic material stack are etched to form the second openings (181, 421). In other words, transfer of the pattern in the patterned lithographic material stack through the second tier structure (232, 242, 265, 70) forms the second openings (181, 421).

In one embodiment, the chemistry of the anisotropic etch process employed to etch through the materials of the second stack (232, 242) can alternate to optimize etching of the third and fourth materials in the second stack (232, 242) while providing a comparable average etch rate for the second dielectric material portion 265. The anisotropic etch can be, for example, a series of reactive ion etches. The sidewalls of the second openings (181, 421) can be substantially vertical, or can be tapered.

The second memory openings 181 are formed through the second tier structure (232, 242, 265, 70) in areas overlying the first memory openings 121, which are filled with the third fill material portions 123. Thus, the second memory openings 181 are formed on third fill material portions 123 (which are formed in the first memory openings 121). The second support openings 421 are formed through the second tier structure (232, 242, 265, 70) in areas overlying the proximal first support openings 321, which are filled with the second fill material portions 323. Thus, the second support openings 421 can be formed on second fill material portions 323 formed in the second subset of the first support openings. The second support openings 421 can be formed through the second portion of the stepped surfaces (i.e., the second stepped surfaces) located on the second alternating stack (232, 242). The second support opening 421 and the second memory openings 181 can be simultaneously formed employing at least one anisotropic etch process.

The lateral dimensions (e.g., a diameter) of the second openings (181, 421) can be comparable to the lateral dimensions of the first openings (121, 221, 321). For example, the lateral dimensions of the second openings (181, 421) can be from about 20 nm to 200 nm at an upper portion of each second opening (181, 421), and can be about 10 nm to 150 nm at a lower portion of each second opening (181, 421). In one embodiment, the second memory openings 181 and the first memory openings 121 can be formed as an array of openings, which can be a periodic two-dimensional array of openings. The second support openings 421 and the first support openings (221, 321) can be formed as discrete openings that are mutually separated from one another, and may, or may not, form a periodic two-dimensional array pattern.

Each bottom surface of the second memory openings 181 may be entirely within the area of a top surface of an underlying third fill material portion 123. Each bottom surface of the second support openings 421 may be entirely within the area of a top surface of an underlying second fill material portion 323. Subsequently, the patterned lithographic material stack can be subsequently removed, for example, by ashing.

Referring to FIGS. 8A and 8B, the material of the second fill material portions 323 and the third fill material portions 123 can be removed from underneath the second support openings 421 and the second memory openings 181, respectively, without removing the first material fill portions 223. An isotropic etch or an anisotropic etch may be performed to remove the material of the second fill material portions 323 and the third fill material portions 123 selective to the materials of the insulating layers (132, 232), the sacrificial material layers (142, 242), and the insulating cap layer 70. In one embodiment, a wet etch process employing a KOH solution can be employed to remove the material of the second fill material portions 323 and the third fill material portions 123. The KOH solution generally provides a crystallographic orientation dependent etch rate on silicon, and can etch amorphous silicon-containing material with selectivity to a single crystalline silicon, and especially selective to a physically exposed (111) surface of silicon. The single crystalline surface of the semiconductor material layer 10 can be physically exposed after removal of the material of the second fill material portions 323 and the third fill material portions 123. Alternatively, if the material of the second fill material portions 323 and the third fill material portions 123 includes a silicon-germanium alloy, a solution including hydrofluoric acid and hydrogen peroxide can be employed to remove the material of the second fill material portions 323 and the third fill material portions 123. Optionally, an overetch may be performed into the semiconductor material layer 10.

Removal of the second fill material portions 323 from underneath the second support openings 421 forms inter-tier support openings 59 extending through the first and second tier structures (132, 142, 165, 232, 242, 265, 70). Each inter-tier support opening 59 includes a volume of a proximal first support opening 321 and a second support opening 421. Each inter-tier support openings 59 extends through a second portion of the stepped surfaces in the terrace region and through the second retro-stepped dielectric material portion 265.

Removal of the third fill material portions 123 from underneath the second memory openings 181 forms inter-tier memory openings 49 extending through the first and second tier structures (132, 142, 165, 232, 242, 265, 70). Each inter-tier memory opening 49 includes a volume of a first memory opening 121 and a second memory opening 181. Each inter-tier memory openings 49 extends through the entirety of the first alternating stack (132, 142) and the second alternating stack (232, 242).

The region overlying the first support pillar structures 223 can be free of any opening extending through the second tier structure (232, 242, 265, 70). Specifically, the region of the second retro-stepped dielectric material portion 265 that does not include any stepped surfaces thereupon and overlies the first retro-stepped dielectric material portion 165 can be free of any openings therethrough. This region is herein referred to as a second-tier-opening-free region 520. Thus, the first material fill portions 223 are not removed and provide support for the insulating layers 132 during and after a subsequent removal of the first sacrificial material layers 142.

Figure 10:
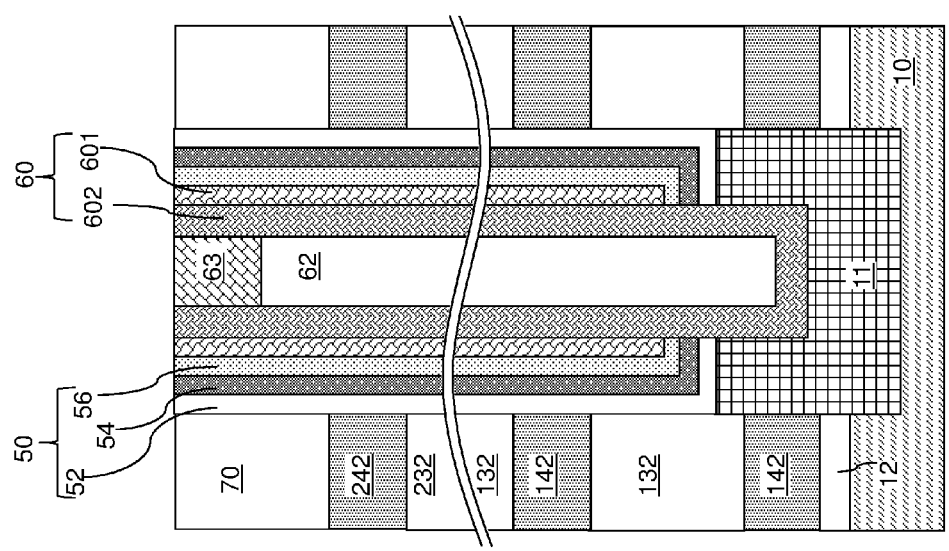
FIG. 10 is a top-down view of a magnified view of a memory stack structure according to an embodiment of the present disclosure.

Referring to FIGS. 9A, 9B and 10, epitaxial channel portions 11 may be optionally formed by a selective epitaxy process at the bottom of the inter-tier memory openings 49 and the inter-tier support openings 59. The epitaxial channel portions 11 comprise a single crystalline semiconductor material in epitaxial alignment with the single crystalline substrate semiconductor material of the semiconductor material layer 10 (or the substrate semiconductor layer 9). Optionally, the epitaxial channel portions 11 can be doped with electrical dopants of a suitable conductivity type. In one embodiment, the semiconductor material layer 10 and the epitaxial channel portions 11 can have a doping of the first conductivity type (e.g., p-type).

Subsequently, a memory stack structure 55 is formed within each inter-stack memory opening 49, and a second support pillar structure 155 is formed within each inter-stack support opening 59. The second support pillar structures 155 and the memory stack structures 55 can be formed simultaneously by depositing a same set of material portions. The memory stack structures 55 and the second support pillar structures 155 are formed through the first and second tier structures (132, 142, 165, 232, 242, 265, 70).

Specifically, a stack of layers including an optional blocking dielectric layer 52, a charge storage layer 54, a tunneling dielectric layer 56, and an optional first semiconductor channel layer 601 can be sequentially deposited in each of the inter-tier memory openings 49 and the inter-tier support openings 59.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers (142, 242) and the insulating layers 32 can have vertically coincident sidewalls, and the charge storage layer 54 can be formed as a single continuous layer.

In another embodiment, the sacrificial material layers (142, 242) can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

The optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by anisotropic etch process.

The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers (142, 242) constitutes a charge storage region.

A surface of the epitaxial channel portion 11 (or a surface of the semiconductor substrate layer 10 in case the epitaxial channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

A second semiconductor channel layer 602 can be deposited directly on the semiconductor surface of the epitaxial channel portion 11 (or on the semiconductor substrate layer 10 if the epitaxial channel portion 11 is omitted), and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

In case the cavity 49' in each memory opening is not completely filled by the second semiconductor channel layer 602, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

The horizontal portion of the dielectric core layer can be removed, for example, by a recess etch from above the top surface of the insulating cap layer 70. Each remaining portion of the dielectric core layer constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP).

Each adjoining pair of a first semiconductor channel layer 601 and a second semiconductor channel layer 602 can collectively form a semiconductor channel 60 through which electrical current can flow when a vertical NAND device including the semiconductor channel 60 is turned on. A tunneling dielectric layer 56 is surrounded by a charge storage layer 54, and laterally surrounds a portion of the semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each set of a memory film 50, a semiconductor channel 60, and an optional dielectric core 62 formed within an inter-tier memory opening 49 constitutes a memory stack structure 55. Each set of a memory film 50, a semiconductor channel 60, and an optional dielectric core 62 formed within an inter-tier support opening 59 constitutes a second support pillar structure 155.

The top surface of each dielectric core 62 can be further recessed within each memory opening, for example, by a recess etch to a depth that is located between the top surface of the insulating cap layer 70 and the bottom surface of the insulating cap layer 70. A doped semiconductor material can be deposited within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch. Each remaining portion of the doped semiconductor material overlying the memory stack structure 55 constitutes a drain region 63, which is a top active region of a vertical field effect transistor including a respective semiconductor channel 60. Each remaining portion of the doped semiconductor material overlying the second support pillar structure 155 constitutes a dummy drain region 163, which has the same composition as the drain regions 63. The dummy drain regions 163 are not electrically active by preventing formation of any electrical connection to the dummy drain region 163. In one embodiment, the drain regions 63 and the dummy drain regions 163 can be heavily doped. In one embodiment, the drain regions 63 and the dummy drain regions 163 can include electrical dopants (p-type dopants or n-type dopants) at an atomic concentration greater than $5.0 \times 10^{19}/cm^3$.

Each of the plurality of memory stack structures 55 and the second support pillar structures 155 includes a respective instance of a layer stack (52, 54, 56, 60) that includes a first dielectric material layer (such as a blocking dielectric layer 52), a second dielectric material layer (such as a tunneling dielectric layer 56), and a semiconductor material layer (such as a semiconductor channel 60). In one embodiment, each layer in the layer stack (52, 54, 56, 60) can be a conformal material layer having a uniform thickness throughout. In one embodiment, each instance of the first dielectric material layer (such as the blocking dielectric layer 52) has a first thickness throughout, each instance of the second dielectric material layer (such as the tunneling dielectric layer 56) has a second thickness throughout, and each instance of the semiconductor material layer (such as a semiconductor channel 60) includes a portion having a third thickness throughout (such as a portion including a layer stack of the first semiconductor channel layer 601 and the second semiconductor channel layer 602).

A top end of each instance of the semiconductor material layer (such as a semiconductor channel 60) is contacted by a bottom surface of a respective doped semiconductor material portion (such as a drain region 63 or a dummy drain region 163) including electrical dopants at an atomic concentration greater than $5.0 \times 10^{19}/cm^3$.

The first support pillar structures 223 are formed through the first portion of the stepped surfaces located on the first alternating stack (132, 142, 165), i.e., through the first stepped surfaces. The second support pillar structures 155 are formed through the second portion of the stepped surfaces located on the second alternating stack (232, 242, 265, 70), i.e., through the second stepped surfaces. The second support pillar structures 155 are more proximal to the plurality of memory stack structures 55 than the first support pillar structures 223 are to the plurality of memory stack structures 55.

Referring to FIGS. 11A and 11B, a contact level dielectric layer 80 can be formed over the second tier structure (232, 242, 265, 70). The contact level dielectric layer 80 includes a dielectric material such as silicon oxide, a dielectric metal oxide, and/or organosilicate glass. In one embodiment, the contact level dielectric layer 80 can be composed primarily of a silicon oxide material. The thickness of the contact level dielectric layer 80 can be in a range from 50 nm to 1,000 nm, although lesser and greater thicknesses can also be employed.

A photoresist layer (not shown) can be applied over the contact level dielectric layer 80, and is lithographically patterned to form at least one elongated opening in each area in which formation of a backside contact via structure is desired. The pattern in the photoresist layer can be transferred through the contact level dielectric layer 80, the second tier structure (232, 242, 265, 70), and the first tier structure (132, 142, 165) employing an anisotropic etch to form the at least one backside trench 79, which extends at least to the top surface of the substrate (9, 10). In one embodiment, the at least one backside trench 79 can include a source contact opening in which a source contact via structure can be subsequently formed.

Referring to FIGS. 12A and 12B, an etchant that selectively etches the second material of the sacrificial material layers (142, 242) with respect to the materials of the insulating layers (132, 232) and the semiconductor material(s) of the substrate (9, 10) can be introduced into the at least one backside trench 79, for example, employing an etch process. Backside recesses (143, 243) are formed in volumes from which the sacrificial material layers (142, 242) are removed. Specifically, first backside recesses 143 are formed in the volumes from which the first sacrificial material layers 142 are removed, and second backside recesses 243 are formed in the volumes from which the second sacrificial material layers 242 are removed.

The removal of the second material of the sacrificial material layers (142, 242) can be selective to the materials of the insulating layers (132, 232), the materials of the retro-stepped dielectric material portions (165, 265), the semiconductor material(s) of the substrate (9, 10), and the material of the outermost layer of the memory films 50. Each backside recess (143, 243) can be a laterally extending cavity having a lateral dimension that is greater than the vertical extent of the cavity. In other words, the lateral dimension of each backside recess (143, 243) can be greater than the height of the backside recess (143, 243). The inter-tier memory openings 49 and the inter-tier support openings 59 are herein referred to as front side openings or front side cavities in contrast with the backside recesses (143, 243). In one embodiment, the memory array region 100 comprises an array of monolithic three-dimensional NAND strings having a plurality of device levels disposed above the substrate (9, 10). In this case, each backside recess (143, 243) can define a space for receiving a respective word line of the array of monolithic three-dimensional NAND strings.

Each of the plurality of backside recesses (143, 243) can extend substantially parallel to the top surface of the substrate (9, 10). A backside recess (143, 243) can be vertically bounded by a top surface of an underlying insulating layer 32 and a bottom surface of an overlying insulating layer 32. In one embodiment, each backside recess (143, 243) can have a uniform height throughout.

Subsequently, physically exposed surface portions of the optional epitaxial channel portions 11 and the semiconductor material layer 10 may be converted into dielectric material portions ((not expressly shown) by thermal conversion and/or plasma conversion of the semiconductor materials into dielectric materials. For example, thermal conversion and/or plasma conversion can be employed to convert a surface portion of each epitaxial channel portion 11 into a tubular dielectric spacer (not shown), and to convert each physically exposed surface portion of the semiconductor material layer 10 into a planar dielectric portion (not shown).

Referring to FIGS. 13A and 13B, a backside blocking dielectric layer (not shown) can be optionally formed. The backside blocking dielectric layer, if present, comprises a dielectric material that functions as a control gate dielectric for the control gates to be subsequently formed in the backside recesses (143, 243). In case the blocking dielectric layer 52 is present within each memory opening, the backside blocking dielectric layer is optional. In case the blocking dielectric layer 52 is omitted, the backside blocking dielectric layer is present The backside blocking dielectric layer can be formed in the backside recesses (143, 243) and on a sidewall of the backside trench 79. The backside blocking dielectric layer can be formed directly on horizontal surfaces of the insulating layers (132, 232) and physically exposed sidewalls of the blocking dielectric 52 within the backside recesses (143, 243). If the backside blocking dielectric layer is formed, formation of the tubular dielectric spacers and the planar dielectric portion prior to formation of the backside blocking dielectric layer is optional. In one embodiment, the backside blocking dielectric layer can be formed by a conformal deposition process such as atomic layer deposition (ALD). The backside blocking dielectric layer can consist essentially of aluminum oxide. The thickness of the backside blocking dielectric layer can be in a range from 1 nm to 15 nm, such as 2 to 6 nm, although lesser and greater thicknesses can also be employed.

The dielectric material of the backside blocking dielectric layer can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. A backside cavity is present within the portion of each backside trench 79 that is not filled with the backside blocking dielectric layer.

At least one conducive material can be deposited to form electrically conductive layers (146, 246). The at least one conductive material can include a metallic liner and a conductive fill material layer. The metallic liner can include a metallic nitride material such as TiN, TaN, WN, an alloy thereof, or a stack thereof. The metallic liner functions as a diffusion barrier layer and an adhesion promotion layer. The metallic liner can be deposited by a conformal deposition method such as chemical vapor deposition (CVD) or atomic layer deposition (ALD), and can have a thickness in a range from 1 nm to 6 nm, although lesser and greater thicknesses can also be employed. The conductive fill material layer can be deposited directly on the metallic liner by a conformal deposition method such as chemical vapor deposition or atomic layer deposition. The conductive fill material layer includes a conductive material. The conductive material can include at least one elemental metal such as W, Cu, Co, Mo, Ru, Au, and Ag. Additionally or alternatively, the conductive fill material layer (146, 246) can include at least one intermetallic metal alloy material. Each intermetallic metal alloy material can include at least two metal elements selected from W, Cu, Co, Mo, Ru, Au, Ag, Pt, Ni, Ti, and Ta. In one embodiment, the conductive fill material layer can consist essentially of W, Co, Mo, or Ru.

Each portion of the at least one conducive material that fills a backside recess (142 or 243) constitutes an electrically conductive layer (146 or 246). The electrically conductive layers (146, 246) include first electrically conductive layers 146 that are formed in the first backside recesses 143 in the first tier structure, and second electrically conductive layers 246 that are formed in the second backside recesses 243 in the second tier structure. The portion of the at least one conductive material that excludes the electrically conductive layers (146, 246) constitutes continuous metallic material layer 46L. A plurality of electrically conductive layers (146, 246) can be formed in the plurality of backside recesses (143, 243), and the continuous metallic material layer 46L can be formed on the sidewalls of each backside trench 79 and over the contact level dielectric layer 80. A backside cavity is present in the portion of each backside trench 79 that is not filled with the backside blocking dielectric layer and the continuous metallic material layer 46L.

While the backside recesses (143, 243) remain as cavities, i.e., between removal of the sacrificial material layers (142, 242) and formation of the electrically conductive layers (146, 246) in the backside recesses (143, 243), the first support pillar structures 223, the second support pillar structures 155, and the memory stack structures 55 support the first and second insulating layers (132, 142), the insulating cap layer 70, and the contact level dielectric layer 80. Thus, each first sacrificial material layer 142 can be replaced with a respective first electrically conductive layer 146, and each second sacrificial material layer 242 can be replaced with a respective second electrically conductive layer 246, while the first support pillar structures 223, the second support pillar structures 155, and the memory stack structures 55 provide structural support to the first and second insulating layers (132, 232). There is no need to form support pillars in the second tier over the first support pillar structures 223 because there are no backside recesses in the second retro-stepped dielectric material portion 265 located over the first support pillar structures 223.

Referring to FIGS. 14A and 14B, the deposited metallic material of the continuous electrically conductive material layer 46L is etched back from the sidewalls of each backside trench 79 and from above the contact level dielectric layer 80, for example, by an isotropic wet etch, an anisotropic dry etch, or a combination thereof. The electrically conductive layers (146, 246) in the backside recesses are not removed by the etch process. In one embodiment, the sidewalls of each electrically conductive layer (146 or 246) can be vertically coincident after removal of the continuous electrically conductive material layer 46L.

Each electrically conductive layer (146 or 246) can function as a combination of a plurality of control gate electrodes located at a same level and a word line electrically interconnecting, i.e., electrically shorting, the plurality of control gate electrodes located at the same level. The plurality of control gate electrodes within each electrically conductive layer (146 or 246) are the control gate electrodes for the vertical memory devices including the memory stack structures 55. In other words, each electrically conductive layer (146 or 246) can be a word line that functions as a common control gate electrode for the plurality of vertical memory devices.

Referring to FIGS. 15A and 15B, an insulating material layer can be formed in the at least one backside trench 79 and over the contact level dielectric layer 80 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed. An anisotropic etch is performed to remove horizontal portions of the insulating material layer from above the contact level dielectric layer 80 and at the bottom of each backside trench 79. Each remaining portion of the insulating material layer constitutes an insulating spacer 74. The anisotropic etch can continue to etch through physically exposed portions of the planar dielectric portion, if present, in each backside trench 79. Thus, an insulating spacer 74 is formed in each backside trench 79 directly on physically exposed sidewalls of the electrically conductive layers (146, 246).

A source region 61 can be formed underneath each backside trench 79 by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can contact a bottom surface of the insulating spacer 74.

A backside contact via structure 76 can be formed within each cavity. Each contact via structure 76 can fill a respective cavity. The backside contact via structures 76 can be formed by depositing at least one conductive material in the remaining unfilled volume (i.e., the backside cavity) of the backside trench 79. For example, the at least one conductive material can include a conductive liner (not expressly shown) and a conductive fill material portion (not expressly shown). The conductive liner can include a metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact level dielectric layer 80 overlying the alternating stack (132, 146, 232, 246)) as a stopping layer. If chemical mechanical planarization (CMP) process is employed, the contact level dielectric layer 80 can be employed as a CMP stopping layer. Each remaining continuous portion of the at least one conductive material in the backside trenches 79 constitutes a backside contact via structure 76. Each backside contact via structure 76 can be formed directly on a top surface of a source region 61. Each backside contact via structure 76 can contact a respective source region 61, and can be laterally surrounded by a respective insulating spacer 74.

Referring to FIGS. 16A and 16B, additional contact via structures (88, 86) can be formed through the contact level dielectric layer 80 and through the retro-stepped dielectric material portions (165, 265). For example, drain contact via structures 88 can be formed through the contact level dielectric layer 80 on each drain region 63. Each drain contact via structure 88 can be formed through the contact level dielectric layer 80 on each of the drain regions 63, while not forming any conductive structure through the contact level dielectric layer 80 over the doped semiconductor material portions of the dummy drain regions 163.

Control gate contact via structures 86 can be formed in the terrace region on the electrically conductive layers (146, 246) through the contact level dielectric layer 80, and through the retro-stepped dielectric material portions (165, 265). The control gate contact via structures 86 vertically extend at least through a dielectric material portion (i.e., the second retro-stepped dielectric material portion 265) within the second tier structure (232, 246, 265, 70), and contact a respective electrically conductive layer selected from the first and second electrically conductive layers (146, 246). Peripheral gate contact via structures (not shown) and peripheral active region contact via structures (not shown) can be formed through the retro-stepped dielectric material portions (165, 265) directly on respective nodes of the peripheral devices 700 (See FIG. 1).

The exemplary structure of the present disclosure can include a monolithic three-dimensional memory device. The three-dimensional memory structure includes a first tier structure (132, 146, 165) comprising a first alternating stack (132, 146) of first insulating layers 132 and first electrically conductive layers 146 and located over a substrate (9, 10); a second tier structure (232, 246, 265, 70) comprising a second alternating stack (232, 246) of second insulating layers 232 and second electrically conductive layers 246 and located over the first tier structure (132, 146, 165). A plurality of memory stack structures 55 extend through the first tier structure (132, 146, 165) and the second tier structure (232, 246, 265, 70). First support pillar structures 223 extend through the first tier structure (132, 146, 165) but not through the second tier structures. The first support pillar structures 223 can have respective topmost surfaces at an interface between the first tier structure (132, 146, 165) and the second tier structure (232, 246, 265, 70). Second support pillar structures 155 extend through the first tier structure (132, 146, 165) and the second tier structure (232, 246, 265, 70). Thus, the first support pillar structures 223 do not extend through the second tier structure and have a different composition (and can have a different number of layers) than the second support pillar structures 155.

In one embodiment, each of the plurality of memory stack structures 55 and the second support pillar structures 155 includes a respective instance of a layer stack (54, 56, 60) that includes a first dielectric material layer (such as a blocking dielectric layer 52), a second dielectric material layer (such as a tunneling dielectric layer 56), and a semiconductor material layer (such as a semiconductor channel 60). In one embodiment, a top end of each instance of the semiconductor material layer (such as the semiconductor channel 60) is contacted by a bottom surface of a respective doped semiconductor material portion (such as a drain region 63 or a dummy drain region 163) including electrical dopants at an atomic concentration greater than $5.0 \times 10^{19}/\text{cm}^3$.

In one embodiment, each instance of a first subset of the doped semiconductor material portion located over the memory stack structures 55 is a drain region 63 that contacts a bottom surface of a respective drain contact via structure 88 embedded in a contact level dielectric layer 80. An entire top surface of each instance of a second subset of the doped semiconductor material portions (such as each dummy drain region 163) located over the support pillar structures 155 is contacted by a bottom surface of the contact level dielectric layer 80 and not electrical contact to a bit line is made to the dummy drain regions 163.

In one embodiment, each of the plurality of memory stack structures 55 and the second support pillar structures 155 includes a respective instance of a dielectric core 62 within a respective semiconductor material layer (i.e., a semiconductor channel 60), each instance of the first dielectric material layer within the memory stack structures 55 comprises a blocking dielectric layer 52, each instance of the second dielectric material layer within the memory stack structures 55 comprises a tunneling dielectric layer 56, and each instance of the semiconductor material layer within the memory stack structures 55 comprises a vertical semiconductor channel 60. The same layers are present within the second support pillar structures and comprise respective dummy layers.

In one embodiment, each instance of the first dielectric material layer (such as the blocking dielectric layer 52) has a first thickness throughout, each instance of the second dielectric material layer (such as the tunneling dielectric layer 56) has a second thickness throughout, and each instance of the semiconductor material layer (such as the semiconductor channel 60) includes a portion (such as a portion including the first semiconductor channel layer 601 and the second semiconductor channel layer 602) having a third thickness throughout.

In one embodiment, each instance of the first support pillar structures 323 comprises a material having electrical resistivity greater than 10 Ω-cm and having a composition different from the material of the first insulating layers 132 and the second support pillar structures 155. In one embodiment, the material of the first support pillar structures 223 can be selected from amorphous silicon, polycrystalline silicon, an amorphous silicon-germanium alloy, and a polycrystalline silicon-germanium alloy.

In one embodiment, the second support pillar structures 155 are more proximal to the plurality of memory stack structures 55 than the first support pillar structures 323 are to the plurality of memory stack structures 55.

A terrace region can be provided in the contact region 200. In the terrace region, each electrically conductive layer (146, 246) other than a topmost electrically conductive layer within the second alternating stack (232, 246) laterally extends farther than any overlying electrically conductive layer (146, 246) within the first and second alternating stacks (132, 146, 232, 246). The terrace region includes stepped surfaces of the first and second alternating stacks (132, 146, 232, 246) that continuously extend from a bottommost layer within the first alternating stack (132, 146) to a topmost layer within the second alternating stack (232, 246); and the first and second support pillar structures (323, 155) are located in the terrace region.

The monolithic three-dimensional memory device can further include control gate contact via structures 86 located within the terrace region, vertically extending at least through a dielectric material portion (i.e., the second retro-stepped dielectric material portion 265) within the second tier structure (232, 246, 265, 70), and contacting a respective electrically conductive layer (146 or 246) selected from the first and second electrically conductive layers (146, 246).

In one embodiment, the first tier structure (132, 146, 165) further comprises a first dielectric material portion (i.e., a first retro-stepped dielectric material portion 165) located over first stepped surfaces of the first alternating stack (132, 146). The second tier structure (232, 246, 265, 70) further comprises a second dielectric material portion (i.e., a second retro-stepped dielectric material portion 265) located over second stepped surfaces of the second alternating stack (232, 246). The first stepped surfaces and the second stepped surfaces are located within a contact region 200. A subset of control gate contact via structures 86 extends through the first dielectric material portion and the second dielectric material portion (i.e., the subset of the control gate contact via structures 86 that are located within the areas of the first support pillar structures 323 and extending onto the first stepped surfaces).

In one embodiment, each of the first support pillar structures 323 contacts a bottom surface of the second dielectric material portion (i.e., the second retro-stepped dielectric material portion 265).

In one embodiment, the monolithic three-dimensional memory structure comprises a monolithic three-dimensional NAND memory device. The first and second electrically conductive layers (146, 246) can comprise, or can be electrically connected to, a respective word line of the monolithic three-dimensional NAND memory device. The substrate (9, 10) can comprise a silicon substrate. The monolithic three-dimensional NAND memory device can comprise an array of monolithic three-dimensional NAND strings over the silicon substrate. At least one memory cell (as embodied as a portion of a charge storage layer 54 at a level of an electrically conductive layer (146 or 246)) in a first device level of the array of monolithic three-dimensional NAND strings can be located over another memory cell (as embodied as another portion of a charge storage layer 54 at a level of another electrically conductive layer (146 or 246)) in a second device level of the array of monolithic three-dimensional NAND strings. The silicon substrate can contain an integrated circuit comprising a driver circuit for the memory device located thereon. The electrically conductive layers (146, 246) can comprise a plurality of control gate electrodes having a strip shape extending substantially parallel to the top surface of the substrate (9, 10). The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10); and a plurality of charge storage elements (as embodied as portions of the charge storage layer 54 that are located at each level of the electrically conductive layers (146, 246)). Each charge storage element can be located adjacent to a respective one of the plurality of semiconductor channels (59, 11, 60).

The sidewalls of the second openings (181, 421) may have a bulging vertical cross-sectional profile such that a middle portion of each second opening (181, 421) laterally protrudes more than the upper portion and the lower portion of the second opening (181, 421). This tendency is greater for the second support openings (181, 421) that are formed through the second retro-stepped dielectric material portion 265 which is more prone to lateral etch than the second sacrificial material layers 242. For example, if the second sacrificial material layers 242 include silicon nitride and if the second retro-stepped dielectric material portion 265 includes a silicon oxide, an opening extending through the entire thickness of the second retro-stepped dielectric material portion 265 is prone to formation of sidewalls having a significantly laterally protruding convex profile. By not forming any opening extending above the first support pillar structures 223 through the entire thickness of the second retro-stepped dielectric material portion 265, i.e., by forming the second-tier-opening-free region 520 (See FIG. 8A) over the first stepped surfaces in the terrace region, formation of a short circuit between the support pillar structure and the backside contact via structures 76 is reduced. In other words, by limiting the vertical extent of the first support pillar structures 223 within the first tier structure (132, 146, 165), formation of openings with a significantly laterally protruding convex profile through the second tier structure (232, 246, 265, 70) can be avoided. Thus, during formation of backside contact trenches 79 at the processing steps of FIGS. 11A and 11B, unintentional merging of the backside contact trenches 79 with openings in the second tier structure ((232, 246, 265, 70) can be reduced. Thus, the exemplary structure of FIGS. 16A and 16B is less prone to electrical shorts between the backside contact via structures 76 and the structures extending through the second tier structure (232, 246, 265, 70) and/or through the first tier structure (132, 146, 165), thereby improving the yield and/or the reliability of the three-dimensional memory devices of the present disclosure.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device comprising:
   a first tier structure comprising a first alternating stack of first insulating layers and first electrically conductive layers and located over a substrate;
   a second tier structure comprising a second alternating stack of second insulating layers and second electrically conductive layers and located over the first tier structure;
   a plurality of memory stack structures extending through the first tier structure and the second tier structure;
   first support pillar structures extending through the first tier structure but not through the second tier structure; and
   second support pillar structures extending through the first tier structure and the second tier structure,
   wherein:
   each of the second support pillar structures comprises different material than a material of the first support pillar structures;
   each of the plurality of memory stack structures and the second support pillar structures includes a respective dielectric core within a respective semiconductor material layer;
   each first dielectric material layer within the memory stack structures comprises a blocking dielectric layer;
   each second dielectric material layer within the memory stack structures comprises a tunneling dielectric layer; and
   each semiconductor material layer within the memory stack structures comprises a vertical semiconductor channel.

2. The monolithic three-dimensional memory device of claim 1, wherein:
   the first support pillar structures have respective topmost surfaces at an interface between the first tier structure and the second tier structure; and
   each of the plurality of memory stack structures and the second support pillar structures includes a respective layer stack that includes a first dielectric material layer, a second dielectric material layer, and a semiconductor material layer.

3. The monolithic three-dimensional memory device of claim 2, wherein:
   a top end of each semiconductor material layer is contacted by a bottom surface of a respective doped semiconductor material portion including electrical dopants at an atomic concentration greater than $5.0 \times 10^{19}/cm^3$;
   each first subset of the doped semiconductor material portion located over the memory stack structures is a drain region that contacts a bottom surface of a respective drain contact via structure embedded in a contact level dielectric layer; and
   an entire top surface of each second subset of the doped semiconductor material portions located over the second support pillar structures is contacted by a bottom surface of the contact level dielectric layer.

4. The monolithic three-dimensional memory device of claim 1, wherein:
   each first dielectric material layer has a first thickness throughout;
   each second dielectric material layer has a second thickness throughout; and
   each semiconductor material layer includes a portion having a third thickness throughout.

5. The monolithic three-dimensional memory device of claim 1, wherein each first support pillar structures comprises a material having electrical resistivity greater than 10 Ω-cm and having a composition different from the material of the first insulating layers.

6. The monolithic three-dimensional memory device of claim 5, wherein the material of the first support pillar structures is selected from amorphous silicon, polycrystalline silicon, an amorphous silicon-germanium alloy, and a polycrystalline silicon-germanium alloy.

7. The monolithic three-dimensional memory device of claim 1, wherein the second support pillar structures are more proximal to the plurality of memory stack structures than the first support pillar structures are to the plurality of memory stack structures.

8. The monolithic three-dimensional memory device of claim 1, further comprising a terrace region in which each electrically conductive layer other than a topmost electrically conductive layer within the second alternating stack laterally extends farther than any overlying electrically conductive layer within the first and second alternating stacks, wherein:
the terrace region includes stepped surfaces of the first and second alternating stacks that continuously extend from a bottommost layer within the first alternating stack to a topmost layer within the second alternating stack; and
the first and second support pillar structures are located in the terrace region.

9. The monolithic three-dimensional memory device of claim 8, further comprising control gate contact via structures located within the terrace region, vertically extending at least through a dielectric material portion within the second tier structure, and contacting a respective electrically conductive layer selected from the first and second electrically conductive layers.

10. The monolithic three-dimensional memory device of claim 9, wherein:
the first tier structure further comprises a first dielectric material portion located over first stepped surfaces of the first alternating stack;
the second tier structure further comprises a second dielectric material portion located over second stepped surfaces of the second alternating stack;
the first stepped surfaces and the second stepped surfaces are located within a contact region; and
a subset of control gate contact via structures extends through the first dielectric material portion and the second dielectric material portion.

11. The monolithic three-dimensional memory device of claim 10, wherein each of the first support pillar structures contacts a bottom surface of the second dielectric material portion.

12. A monolithic three-dimensional memory device comprising:
a first tier structure comprising a first alternating stack of first insulating layers and first electrically conductive layers and located over a substrate;
a second tier structure comprising a second alternating stack of second insulating layers and second electrically conductive layers and located over the first tier structure;
a plurality of memory stack structures extending through the first tier structure and the second tier structure;
first support pillar structures extending through the first tier structure but not through the second tier structure; and
second support pillar structures extending through the first tier structure and the second tier structure,
wherein:
the monolithic three-dimensional memory device comprises a monolithic three-dimensional NAND memory device;
the first and second electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels extends substantially perpendicular to a top surface of the substrate; and
a plurality of charge storage elements, each charge storage element located adjacent to a respective one of the plurality of semiconductor channels.

13. A monolithic three-dimensional memory device comprising:
a first tier structure comprising a first alternating stack of first insulating layers and first electrically conductive layers and located over a substrate;
a second tier structure comprising a second alternating stack of second insulating layers and second electrically conductive layers and located over the first tier structure;
a plurality of memory stack structures extending through the first tier structure and the second tier structure;
first support pillar structures extending through the first tier structure but not through the second tier structure; and
second support pillar structures extending through the first tier structure and the second tier structure,
wherein:
the first support pillar structures have respective topmost surfaces at an interface between the first tier structure and the second tier structure;
each of the plurality of memory stack structures and the second support pillar structures includes a respective layer stack that includes a first dielectric material layer, a second dielectric material layer, and a semiconductor material layer;
a top end of each semiconductor material layer is contacted by a bottom surface of a respective doped semiconductor material portion including electrical dopants at an atomic concentration greater than $5.0 \times 10^{19}/cm^3$;
each first subset of the doped semiconductor material portion located over the memory stack structures is a drain region that contacts a bottom surface of a respective drain contact via structure embedded in a contact level dielectric layer; and
an entire top surface of each second subset of the doped semiconductor material portions located over the second support pillar structures is contacted by a bottom surface of the contact level dielectric layer.

14. The monolithic three-dimensional memory device of claim 13, wherein each second support pillar structure comprises different material than a material of the first support pillar structures.

15. The monolithic three-dimensional memory device of claim 14, wherein:
   each of the plurality of memory stack structures and the second support pillar structures includes a respective dielectric core within a respective semiconductor material layer;
   each first dielectric material layer within the memory stack structures comprises a blocking dielectric layer;
   each second dielectric material layer within the memory stack structures comprises a tunneling dielectric layer; and
   each semiconductor material layer within the memory stack structures comprises a vertical semiconductor channel.

16. The monolithic three-dimensional memory device of claim 14, wherein:
   each first dielectric material layer has a first thickness throughout;
   each second dielectric material layer has a second thickness throughout; and
   each semiconductor material layer includes a portion having a third thickness throughout.

17. The monolithic three-dimensional memory device of claim 13, wherein each first support pillar structure comprises a material having electrical resistivity greater than 10 Ω-cm and having a composition different from the material of the first insulating layers.

18. The monolithic three-dimensional memory device of claim 17, wherein the material of the first support pillar structures is selected from amorphous silicon, polycrystalline silicon, an amorphous silicon-germanium alloy, and a polycrystalline silicon-germanium alloy.

19. The monolithic three-dimensional memory device of claim 13, wherein the second support pillar structures are more proximal to the plurality of memory stack structures than the first support pillar structures are to the plurality of memory stack structures.

20. The monolithic three-dimensional memory device of claim 13, further comprising a terrace region in which each electrically conductive layer other than a topmost electrically conductive layer within the second alternating stack laterally extends farther than any overlying electrically conductive layer within the first and second alternating stacks,
   wherein:
   the terrace region includes stepped surfaces of the first and second alternating stacks that continuously extend from a bottommost layer within the first alternating stack to a topmost layer within the second alternating stack; and
   the first and second support pillar structures are located in the terrace region.

21. A monolithic three-dimensional memory device comprising:
   a first tier structure comprising a first alternating stack of first insulating layers and first electrically conductive layers and located over a substrate;
   a second tier structure comprising a second alternating stack of second insulating layers and second electrically conductive layers and located over the first tier structure;
   a plurality of memory stack structures extending through the first tier structure and the second tier structure;
   first support pillar structures extending through the first tier structure but not through the second tier structure;
   second support pillar structures extending through the first tier structure and the second tier structure;
   a terrace region in which each electrically conductive layer other than a topmost electrically conductive layer within the second alternating stack laterally extends farther than any overlying electrically conductive layer within the first and second alternating stacks, wherein the terrace region includes stepped surfaces of the first and second alternating stacks that continuously extend from a bottommost layer within the first alternating stack to a topmost layer within the second alternating stack, and the first and second support pillar structures are located in the terrace region; and
   control gate contact via structures located within the terrace region, vertically extending at least through a dielectric material portion within the second tier structure, and contacting a respective electrically conductive layer selected from the first and second electrically conductive layers.

22. The monolithic three-dimensional memory device of claim 21, wherein:
   the first tier structure further comprises a first dielectric material portion located over first stepped surfaces of the first alternating stack;
   the second tier structure further comprises a second dielectric material portion located over second stepped surfaces of the second alternating stack;
   the first stepped surfaces and the second stepped surfaces are located within a contact region; and
   a subset of control gate contact via structures extends through the first dielectric material portion and the second dielectric material portion.

23. The monolithic three-dimensional memory device of claim 22, wherein each of the first support pillar structures contacts a bottom surface of the second dielectric material portion.

24. The monolithic three-dimensional memory device of claim 21, wherein:
   the monolithic three-dimensional memory device comprises a monolithic three-dimensional NAND memory device;
   the first and second electrically conductive layers comprise, or are electrically connected to, a respective word line of the monolithic three-dimensional NAND memory device;
   the substrate comprises a silicon substrate;
   the monolithic three-dimensional NAND memory device comprises an array of monolithic three-dimensional NAND strings over the silicon substrate;
   at least one memory cell in a first device level of the array of monolithic three-dimensional NAND strings is located over another memory cell in a second device level of the array of monolithic three-dimensional NAND strings;
   the silicon substrate contains an integrated circuit comprising a driver circuit for the memory device located thereon;
   the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and the array of monolithic three-dimensional NAND strings comprises:

a plurality of semiconductor channels, wherein at least one end portion of each of the plurality of semiconductor channels extends substantially perpendicular to a top surface of the substrate; and a plurality of charge storage elements, each charge storage element located adjacent to a respective one of the plurality of semiconductor channels.

* * * * *